US 8,571,237 B2

(12) United States Patent
Staal et al.

(10) Patent No.: US 8,571,237 B2
(45) Date of Patent: Oct. 29, 2013

(54) MULTI-ZONE AUDIO AMPLIFICATION SYSTEM FOR MULTIMEDIA

(75) Inventors: Steven D. Staal, Empire, CA (US); Brian S. Boyer, Redwood City, CA (US)

(73) Assignee: Amp'd PC Technologies, LLC, Broomfield, CO (US)

( * ) Notice: Subject to any disclaimer, the term of this patent is extended or adjusted under 35 U.S.C. 154(b) by 875 days.

(21) Appl. No.: 12/497,459

(22) Filed: Jul. 2, 2009

(65) Prior Publication Data

US 2011/0004716 A1    Jan. 6, 2011

(51) Int. Cl.
*H04B 1/00*    (2006.01)

(52) U.S. Cl.
USPC .............................. 381/120; 381/104; 330/10

(58) Field of Classification Search
USPC ............. 381/1, 56, 58, 107, 17, 23, 119, 104, 381/77, 61, 63, 80, 311, 123, 120; 330/10, 330/251; 370/537, 303, 380
See application file for complete search history.

(56) References Cited

U.S. PATENT DOCUMENTS

| | | | |
|---|---|---|---|
| 5,777,512 A | 7/1998 | Tripathi et al. | |
| 6,456,501 B1* | 9/2002 | Rubenstein et al. | 361/759 |
| 6,904,062 B1* | 6/2005 | Tng et al. | 370/537 |
| 7,088,835 B1* | 8/2006 | Norris et al. | 381/107 |
| 7,276,963 B2 | 10/2007 | Wegner | |
| 8,014,544 B2 | 9/2011 | Freels et al. | |
| 2006/0091945 A1* | 5/2006 | Wegner | 330/10 |
| 2006/0147067 A1* | 7/2006 | Lee | 381/306 |
| 2008/0152160 A1* | 6/2008 | Chew et al. | 381/71.6 |
| 2008/0288600 A1* | 11/2008 | Clark | 709/206 |
| 2009/0222731 A1* | 9/2009 | Stewart et al. | 715/727 |

OTHER PUBLICATIONS

Philips Semiconductors,TDA8588J; TDA8588xJ; I2C-bus controlled 4x50 Watt power amplifier and multiple voltage reulator; Product specification data sheet; Feb. 24, 2004.*
Audiotrak CARDamp MK-II, Ego Systems, Inc. Products, [online] [retrieved May 9, 2013], 3 pages, retrieved from the internet archive Wayback Machine URL: http://web.archive.org/web/20041113141614/http://www.egosys.co.jp/HP/php/cardampmk2.php.
Philips Semiconductors, Integrated Circuits, Data Sheet, TDA8588J; TDA8588xJ I²C-bus Controlled 4 X 50 Watt Power Amplifier and Multiple Voltage Regulator, Feb. 24, 2004, 53 pages.

(Continued)

*Primary Examiner* — Vivian Chin
*Assistant Examiner* — Friedrich W Fahnert
(74) *Attorney, Agent, or Firm* — Syndicated Law; Brian S. Boyer

(57) ABSTRACT

The teachings are directed to a power amplifier expansion card ("amplifier card") for a computer. The amplifier card receives audio data through an input port and amplifies the audio data to high-level passive speaker power for transmissions through an output port. The amplifier card can comprise a circuit board having (i) at least two audio channels; (ii) an audio power amplification circuit for amplifying audio power to at least 20 W RMS per channel; and (iii) an onboard cooling system. The amplifier card can be used, for example, in a multimedia system having at least a studio controller operably connected to the amplifier card for receiving and processing input audio data. Examples of such multimedia systems include, but are not limited to, a television home entertainment system, an audio home entertainment system, a music production studio system, a gaming system, a personal computing system, or any combination thereof.

20 Claims, 20 Drawing Sheets

(56) References Cited

OTHER PUBLICATIONS

Sonice Tio Board, SI5.com, [online] [retrieved on May 10, 2013], 1 page, URL: www.si5.com/amplifiers_sonic.php.

PC Digital Amplifier Card, [online] [retrieved on May 9, 2013] http://www.hiwtc.com/products/pc-digital-amplifier-card-1542-5072.htm.

* cited by examiner

MULTI-ZONE AUDIO AMPLIFICATION SYSTEM FOR MULTIMEDIA

BACKGROUND

1. Field of the Invention

The teachings provided herein are generally directed to a discrete power amplifier expansion card for a computer, wherein the expansion card receives line-level audio data through an input port and amplifies the audio data to high-level passive speaker power for transmissions through an output port.

2. Description of the Related Art

Audio amplification for desktop and workstation computers is currently accomplished using an external amplification of the audio leaving the computer. For example, a user is generally limited to purchasing externally-powered active speaker systems for his desktop computer, and these systems require an independent external audio amplifier. This limitation in the availability of audio-amplification hardware in personal computing has hindered the use of the personal computer ("PC") and the ability to integrate personal computers with other systems and applications. As such, there are a number of audio-related painpoints to be addressed in the art of personal computing, and a number of significant innovations possible, through the advancement of audio amplification in personal computing and the integration of personal computing with other systems and applications needed by a mass market of consumers.

A first significant painpoint is that there is no high power amplification hardware available for personal computers that enables a user to adequately amplify audio data within the personal computer system itself and send the amplified audio data directly to external passive loudspeakers. Currently, with the absence of such high power amplification hardware, off-the-shelf computers cannot be purchased with such capabilities, users cannot modify a personal computer to obtain high-power audio amplification, and therefore, the integration of the personal computer with other systems, such as multimedia systems, becomes much more difficult. This is particularly true if its desired to integrate all functionalities of the multimedia system into the personal computer as a single unit.

Accordingly, a second painpoint is the need to purchase, house, and integrate several independent media components to enjoy a full multimedia experience that may include, for example, video and amplified audio, as well as personal computing, and music production capabilities. In fact, looking at the average household, an average user may want to include televisions, DVD players, CD players, video cameras, gaming machines, satellite radios, iPods, karaoke machines, musical instruments, laptop computers, desktop computers, and more. Users want such a system but are most often deterred by the complexities associated with the design, setup, operation, and maintenance of such a system, particularly given the limited means by which such a system can currently be constructed. In addition, even if the complexities of such a construct can be overcome, the user is still faced with a large footprint in an often already overcrowded living space. Currently, the user may purchase a large, and often expensive, entertainment center to contain all needed or desired components. Regardless, even with the large entertainment center, some of the desired components still may not be integrated with the other system components due to lack of space, thus requiring the user to store desired components in other storage spaces, closets, etc.

The desire to integrate personal computing into a home's centralized entertainment center is strong and has been felt for quite some time. Many personal computer owners have opted for the use of laptop computers to enable, for example, watching television while surfing the net. In fact, watching television often spawns an increased need for information from the internet, as well as the common business practices of ordering products and/or services viewed on television via the internet.

Accordingly, users most often separate the location of their personal computer from their other multimedia components due to space requirements and limitations. Most users may consider the integration of a personal computer into their existing multimedia system as a process requiring excessive space and, most likely, too much space for one centralized location. Moreover, the routing of audio throughout such a system would currently be considered to require additional speakers for the personal computer system, which would require even more space in an already crowded living area. The integration of these individual components to create a home entertainment system with a small footprint is a long felt and unsolved need, where an obstacle to integrating the system components is the inability to combine the necessary media components through a central data routing hub that also amplifies audio data for all components of such a multimedia system.

Personal computers are currently being used as a means to listen to music. However, personal computers are faced with limitations in the data formats they can read. For example, another painpoint faced by the user is the inability to enjoy music derived from the new digital SACD (Super Audio CD) and DVD-Audio formats through a personal computer. The new formats were established in an effort to re-create music as close to the analogue domain as possible. Both SACD and DVD-Audio offer higher resolution sound than standard CDs. In many cases, they provide multichannel surround-sound music, as well. Though these discs look exactly like standard CDs (and DVDs), they require a player that can handle these formats, and personal computers do not currently have such a player. Plus, to enjoy multichannel music, you will need a receiver with 5.1-channel inputs and a home theater speaker setup. Traditional CDs lack warmth and detail due in part to their limited upper bandwidth of 22 kHz. SACD and DVD-Audio is a next generation medium for enhanced sound quality with a frequency response of 20 Hz-100 kHz and a dynamic range of up to 120 dB across the audible frequency range. In order to complement SACD and DVD-Audio, the bandwidth of amplifiers and pre-amplifiers must be at least equal to the bandwidth of these formats.

One of skill will appreciate having a power amplifier expansion card that simply plugs into a desktop computer and instantly turns it into anything from a high-end home theater system to a full-blown multimedia production studio. One of skill will also appreciate having a multimedia system that includes personal computing capabilities as well as multimedia and sound production capabilities that can be stand alone from the operation of the computer. One of skill will also appreciate having a personal computer that can support the next generation audio capabilities of SACD and DVD-Audio. One of skill will also appreciate having an extension card that will increase the audio amplification power to support additional amplified audio outputs and multizone systems to support a plurality of rooms throughout a home with a single computer system. These embodiments, and others, are enabled for a person of skill in the teachings provided herein.

SUMMARY

The teachings provided herein are generally directed to a power amplifier expansion card for a computer, wherein the expansion card receives audio data through an input port and amplifies the audio data to high-level passive speaker power for transmissions through an output port.

The teachings include an audio power amplifier expansion card comprising a circuit board having (i) at least two audio channels; (ii) an audio power amplification circuit for amplifying audio power to at least 20 W (watts) RMS (root mean squared) per channel; and (iii) an onboard cooling system. In some embodiments, the onboard cooling system can comprise a fan and liquid cooling.

The expansion card can further comprise a mounting bracket operably connected to the circuit board and having I/O ports. In these embodiments, the expansion card operably interfaces with a motherboard of a computer. And, in some embodiments, the expansion card operates independent of the operating system of the computer.

In some embodiments, the audio power amplification circuit amplifies audio power to at least 50 W RMS per channel and has at least 100 W RMS total audio amplification power. Moreover, the audio power amplification circuit can comprise an output stage consisting of discrete circuitry. In some embodiments, the expansion card has a circuit board comprising integrated audio amplifier circuitry.

In some embodiments, the expansion card can function to receive and amplify audio data having frequencies that are outside of the range of normal hearing in a human to add to a user's experience. The user has a simulation of live sound by including sensations felt by such non-audible frequencies that complement a traditional non-live "listening" experience. In some embodiments, the expansion card functions to receive and amplify audio data having a frequency from about 10 Hz to about 100 kHz. In some embodiments, the expansion card functions to (i) receive and amplify standard digital audio data, standard analog audio data, or a combination thereof; and optionally, (ii) operate independent of operation of the computer.

In some embodiments, the expansion card can have audio mixing functionality for splitting mono audio into at least two audio channels or combining more than two audio channels into two audio channels, (can sing and play guitar on top of music cd, etc.). In some embodiments, the expansion card can have audio routing functionality for splitting audio into more than two audio channels.

The teachings include a multimedia system comprising the expansion card described above and a studio controller operably connected to the expansion card for receiving and processing input audio data. The studio controller can comprise a receiver of audio data from one or more sources; a mixer of the audio data from the one or more sources; state selectors for controlling audio data input and output; and, a field-programmable-gate-array (FPGA) or application-specific-integrated-circuit (ASIC) microprocessor.

In some embodiments, the multimedia system comprises a receiver of audio and video data for television, wherein the receiver of audio and video data is operably connected to the system to amplify the audio data. In some embodiments, the multimedia system comprises a receiver for audio data for radio, wherein the receiver of audio data is operably connected to the system to amplify the audio data.

The multimedia system can further comprise an audio effects bay operably connected to the system for altering the audio data from the one or more sources. In some embodiments, the multimedia system can further comprise one or more components selected from the group consisting of a disc player, a TV tuner and/or digital video recorder/receiver, a graphic equalizer, and a studio mixer. In some embodiments, the one or more components operably connect to the system, communicate with the studio controller, and have a form factor complementary to a 5.25 inch drive bay of a workstation computer.

The multimedia system can further comprise a peripheral amplifier extension card operably connected to the system. The extension card can comprise a second circuit board having (i) at least three audio channels; (ii) an audio power amplification circuit for amplifying audio power to at least 20 W RMS per channel; and (iii) an onboard cooling system; and a mounting bracket operably connected to the second circuit board and having I/O ports. In these embodiments, the extension card operably interfaces with the motherboard of the computer and the expansion card. The multimedia system can comprise at least 5 audio output channels.

In some embodiments, the multimedia system can comprise an auto-amplifier bridge gate. The auto-amplifier bridge gate can function, for example, to (i) identify the absence of a passive speaker load at an audio output port of the extension card and (ii) bridge power generated by the extension card back to the expansion card to increase the audio power output of the expansion card.

The multimedia system can include an expansion card comprising (i) 2 audio output channels having at least 50 W RMS per channel, and (ii) an onboard cooling system. In some embodiments, the peripheral amplifier extension card can have (i) 3 audio output channels consisting of 2 audio output channels having at least 50 W RMS per channel and 1 audio output channel having at least 75 W RMS per channel; and (ii) an onboard cooling system.

The multimedia system can include an expansion card comprising (i) 2 audio output channels having at least 50 W RMS per channel, and (ii) an onboard cooling system. In some embodiments, the peripheral amplifier extension card comprises (i) 5 audio output channels consisting of 4 audio output channels having at least 50 W RMS per channel and 1 audio output channel having at least 75 W RMS per channel; and (ii) an onboard cooling system. The multimedia system can comprise at least 7 audio output channels.

The teachings also include a multizone audio amplification system. The multizone audio amplification system comprises an expansion card as described above, as well as a peripheral amplifier extension card operably connected to the system. The peripheral amplifier extension card comprises a second circuit board having (i) at least 3 audio output channels; (ii) an audio power amplification circuit for amplifying audio power to at least 20 W RMS per channel; and (iii) an onboard cooling system. In these embodiments, the extension card can have a mounting bracket operably connected to the second circuit board and having I/O ports; wherein, the extension card operably interfaces with the motherboard of the computer. In these embodiments, the multizone audio amplification system can include a studio controller operably connected to the system and functioning to process input audio data. The studio controller can comprise a receiver of audio data from one or more sources, a mixer of the audio data from the one or more sources, state selectors for controlling audio data input and output; and, a field-programmable-gate-array (FPGA) or application-specific-integrated-circuit (ASIC) microprocessor. And, in these embodiments, the multizone audio amplification system can also include a multizone audio amplification manager operably connected to the system and functioning to (i) identify independent sources of audio data input; (ii) split, alternate, or merge the direction of the amplified audio data output; and (iii) provide for a plurality of independent amplified audio data streams.

The multizone audio amplification system can have an expansion card comprising discrete audio amplifier circuitry.

In some embodiments, the discrete audio amplifier circuitry can amplify audio power to at least 50 W RMS per channel in these embodiments, wherein the circuitry can have at least 100 W RMS total audio amplification power.

DETAILED DESCRIPTION OF THE INVENTION

Figure 1A:
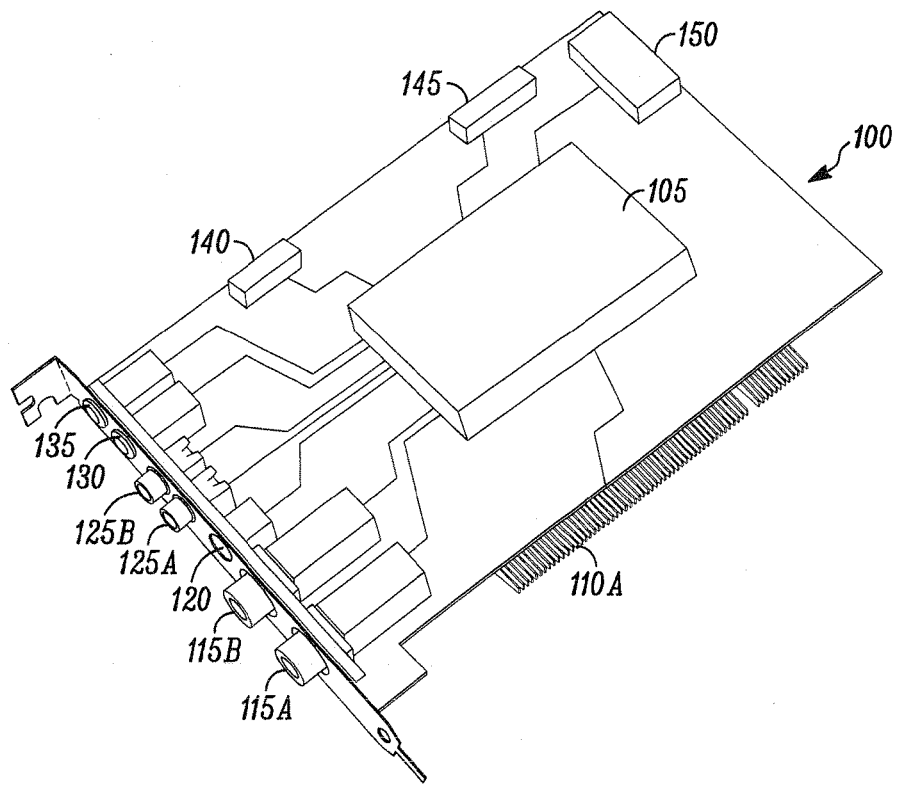
FIGS. 1A-1E illustrate perspective views of the amplifier card, PCI connectors, and circuitry, according to some embodiments.

The teachings provided herein are generally directed to a power amplifier expansion card ("expansion card" or "amplifier card") for a computer, wherein the expansion card receives audio data through an input port and amplifies the audio data to high-level passive speaker power for transmissions through an output port. In some embodiments, the expansion card can be a discrete power amplifier expansion card for a computer for receiving line-level audio data through the input port and amplifying the audio data to high-level passive speaker power for transmissions through the output port.

One of skill will appreciate that any computer having a motherboard can be used in most embodiments provided, however, that in some embodiments, an external power supply unit (PSU) may be required to supply sufficient power to the computer to drive the amplifier card. The computer can be, for example, a desktop computer or a workstation computer. The "motherboard" is a component that comprises expansion card bus slots suitable for operably receiving the amplifier card.

One of skill will appreciate that the amplifier cards taught herein are "post-amplifiers," which are distinguishable from "pre-amplifiers." The SOUNDBLASTER card, for example, is distinguishable in that it is a pre-amplifier that converts a low-level data to a line-level audio data. The SOUNDBLASTER card amplifies low-level data to line-level data and manipulates the audio data to improve data fidelity for further processing. A "discrete power amplifier," as taught herein comprises a circuitry having laterally configured MOSFET transistors to provide an efficient means of producing power from a low voltage input, wherein such circuitry can operate at very low currents. In some embodiments, the discrete lateral MOSFET circuitry composes the output stage of the amplifier circuitry.

The teachings include an audio power amplifier expansion card comprising a circuit board having (i) at least two audio channels; (ii) an audio power amplification circuit for amplifying audio power to at least 20 W RMS per channel; and (iii) an onboard cooling system. In some embodiments, the onboard cooling system can comprise a fan and liquid cooling. One of skill will appreciate that other technologies may be useful with the teachings herein such as, for example, copper-pin-fin cooling technology.

The expansion card can further comprise a mounting bracket operably connected to the circuit board and having I/O ports. In these embodiments, the expansion card operably interfaces with a motherboard of a computer. And, the expansion card can operate in many embodiments without requiring a particular motherboard/expansion card combination, such that the expansion card can operate with most common desktop computer motherboards, for example. Moreover, the expansion card can operate independent of any software, such as the operating system of the computer. It should be appreciated that the independence of the card from an operating system allows for a cross-platform functionality, such that the amplifier card can be used with any computer system platform recognized by one of skill to be suitable for operating with the amplifier card.

Figure 1B:
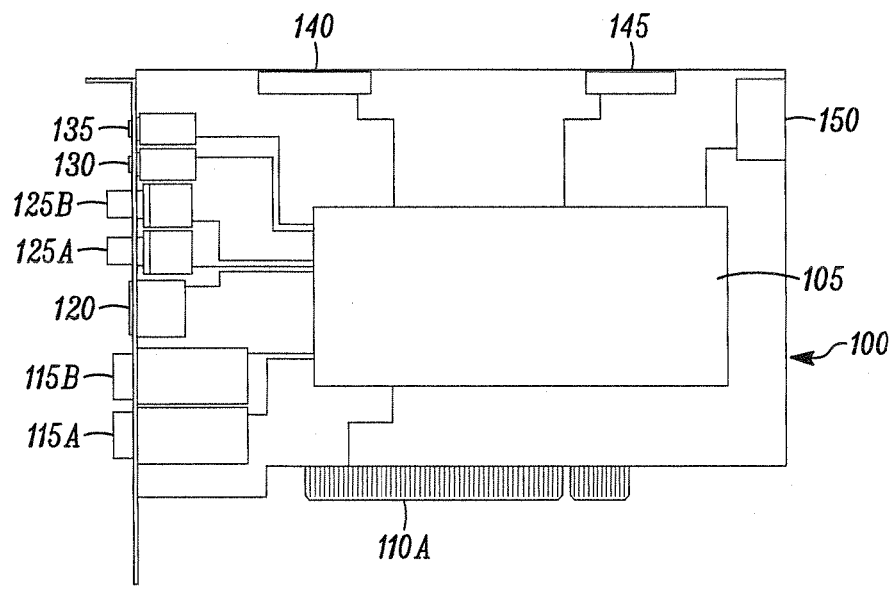

FIGS. 1A through 1E illustrate perspective views of the amplifier expansion card, PCI connectors, and circuitry, according to some embodiments. FIGS. 1A and 1B illustrate overall views of components of the amplifier card 100. In some embodiments, the amplifier card 100 receives line-level audio data through the card inputs and amplifies them to high-level passive speaker power through the card outputs. As such, the amplifier card 100 can eliminate the need for an external audio amplifier, home theater system, or active speakers to amplify the sound by providing a desktop computer. Amplification can occur within the computer itself, for example, and the amplified audio data is then transmitted directly from the computer system to external, passive loudspeakers.

In some embodiments, the amplifer card 100 functions to (i) receive and amplify standard digital audio data, standard analog audio data, or a combination thereof; and, in some embodiments, (ii) operate independent of operation of the computer. The ability of the amplifier card 100 to operate independent of the operation of the computer gives the amplifier card 100 a unique cross-platform functionality, providing the manufacturer with less production complexity, the user with less complexity at the time of purchase, and all with a beneficial interchangeability of the amplifier card 100 between systems.

Figure 1C:
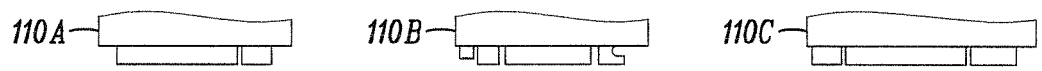

The amplifier circuitry 105 can comprise a discrete power amplifier designed to fit and function on a PCI (Peripheral Component Interconnect), PCIe (Peripheral Component Interconnect Express), or PCI-X (PCI extended) type expansion card. FIG. 1C illustrates an example of interface connectors 110A-110C that can be used in various form factors to interface with desktop or multi-media computer motherboards.

It should be appreciated that, in many embodiments, the amplifier card 100 is not dependant on a specific PCI connection design. For example, the amplifier card 100 can be designed in any form factor known to one of skill to be useful according to the teachings provided herein. The PCI-type amplifier card 100 can be altered, modified, or replaced by changing its form factor to any other internal ATX computer hardware component such as, for example, a 5.25" drive bay box, a 3.5" drive bay box, or a hard-drive rack component. Moreover, the PCI, PCI-X, and PCIe form factors can be altered, modified, or replaced, for example, by replacing the current production standards of the PCI connection with any of a variety of interfaces that can be contemplated by one of skill.

It should also be appreciated that, in some embodiments, the amplifier circuitry can be altered, modified, or replaced with components known to one of skill. In some embodiments, integrated type circuitry can be used. For example, the amplifier circuitry can be modified using IC-type power amplifier chips that include, but are not limited to, LM3876 or LM3886 audio power amplifier integrated circuit chips available from National Semiconductor of Santa Clara, Calif. In some embodiments, the interface can provide an always-on power supply of 3.3V for auto-sense circuitry control.

Figure 1D:
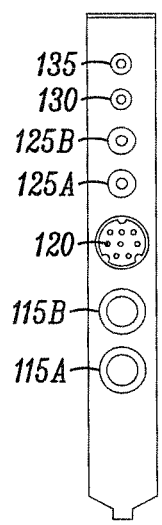

FIG. 1D illustrates and example of input and output connectors of the amplifier card 100, according to some embodiments. Amplified audio data output can be transmitted through any connector, configuration, or other means, including wireless means, known to one of skill. The amplified audio can be transmitted through audio outputs 115A and 115B, for example. In some embodiments the audio outputs can comprise ¼" phone speaker power (L/R) outputs, which are ¼" phone jacks (a 2-conductor tip-sleeve configuration) for heavy-duty loudspeaker applications. It should be appreciated, however, that the audio outputs can be altered, modified, or replaced by any jack type configuration known to one of skill.

Audio data input can be received through any connector, configuration, or other means, including wireless means, known to one of skill. For example, an 8-pin mini-DIN breakout input connector 120 can be used to transmit line-level input to the expansion card from multi-channel audio devices, such as 5.1 or 7.1 surround-sound. It should be appreciated that the 8-pin mini-DIN breakout input connector can be altered, modified, or replaced by changing the pin count of the mini-DIN connector, by using a specialty connector, or by eliminating the 8-pin mini-DIN connector and its multi-channel input capabilities all together, for example, and using stereo input only.

In some embodiments, RCA auxiliary (L/R) line inputs 125A, 125B are jacks (phono connectors) that can be used for auxiliary line-level inputs from stereo audio devices. In some embodiments, the input can be used to automatically detect the presence of audio data and appropriately isolate or mix the audio data for amplification relative to the expansion card configuration. It should be appreciated that the RCA auxiliary line inputs 125A, 125B can be altered, modified, or replaced by changing the input connector type, such as by using a single 3/32" mini-stereo phone jack, or other tip-sleeve connector. This input can also be completely removed if any other line-level input is available to be amplified by the expansion card.

In some embodiments, a ⅛" stereo line-in, in the form of a ⅛" stereo jack (3-conductor tip-sleeve-ring configuration) 130, can be used for receiving line-level input from stereo audio devices. In some embodiments, this input can be used to automatically detect the presence of audio data and appropriately isolate or mix the audio data for amplification relative to the expansion card configuration. It should be appreciated that the ⅛" stereo line-in 130 can be altered, modified, or replaced by changing the connector, such as by using a 3/32" mini-stereo phone jack, or some other specialty connector.

In some embodiments, a ⅛" stereo mix line-out, in the form of a ⅛" stereo jack 135, can be used for transmitting line-level output for stereo recording devices. In some embodiments, this output can provide the final mixed audio transmitted to the discrete power amplifier. It should be appreciated that the ⅛" stereo mix line-out 135 can be altered, modified, or replaced by changing the connector, such as by using 3/32" mini-stereo phone jack, or some other specialty connector.

FIGS. 1A and 1B illustrate additional I/Os that can be used to operably connect other components to a system comprising the amplifier card. In some embodiments, the amplifier card includes an I/O connector 140 for a peripheral amplifier extension card, for operably connecting the extension card to a system comprising the amplifier card. The extension card, described in more detail below, can comprise discrete power amplifier circuitry, for example. In some embodiments, the amplifier card can automatically detect the presence of the extension card and change the audio data mixing array to accommodate the additional power provided by the extension card, as well as route the audio data to the proper output channels accordingly. It should be appreciated that the I/O connector 140 for the extension card can be altered, modified, or replaced by using any number of specialty connectors known to one of skill. Moreover, it should be noted that a system comprising the amplifier card can operate without the extension card in some embodiments.

In some embodiments, the amplifier card includes an I/O connector 145 for a studio controller, for operably connecting the studio controller to a system comprising the amplifier card. In some embodiments, the amplifier card can automatically detect the presence of the studio controller, which is capable of digitally processing all audio-related input data, including data of radio origin, as well as redirecting the data back to the amplifier card for additional processing. It should be appreciated that the I/O connector 145 for the studio controller can be altered, modified, or replaced by using any number of specialty connectors. Moreover, it should be noted that a system comprising the amplifier card can operate without the studio controller, in some embodiments.

In some embodiments, the amplifier card includes a MOLEX 12V power supply input 150 for receiving 12V power from a power supply unit, such as the computer power supply unit. Power required by amplifier card may be greater than that provided by many standard off-the-shelf computer power supply units, particularly if the amplifier card is used in combination with an extension card. In some embodiments, a computer's original power supply unit can be replaced and/or upgraded with an after-market product having a higher power to obtain maximum performance. It should be appreciated that the power supply input 150 can be altered, modified, or replaced by changing the connector design, or by changing the power supply source from internal to external. In the latter case, an external transformer could be used to supply power to the amplifier card, and the input connector could be specifically designed to mate with the connector of the external transformer.

In some embodiments, the audio power amplification circuit is ultra-high power in that it amplifies audio power to at least 50 W RMS per channel at 8 Ohms per channel and produces at least 100 W RMS total audio amplification power. Moreover, the audio power amplification circuit can comprise an output stage consisting of discrete circuitry such that, for example, the output stage of the amplifier can be 100% discrete circuitry in some embodiments. The circuitry can comprise, for example, a high-grade ±30V lateral MOSFET (metal-oxide-semiconductor field-effect transistors) circuitry in the output stage of a discrete power amplifier circuit. In some embodiments, the amplifier card has a circuit board comprising integrated audio amplifier circuitry.

Figure 1E:
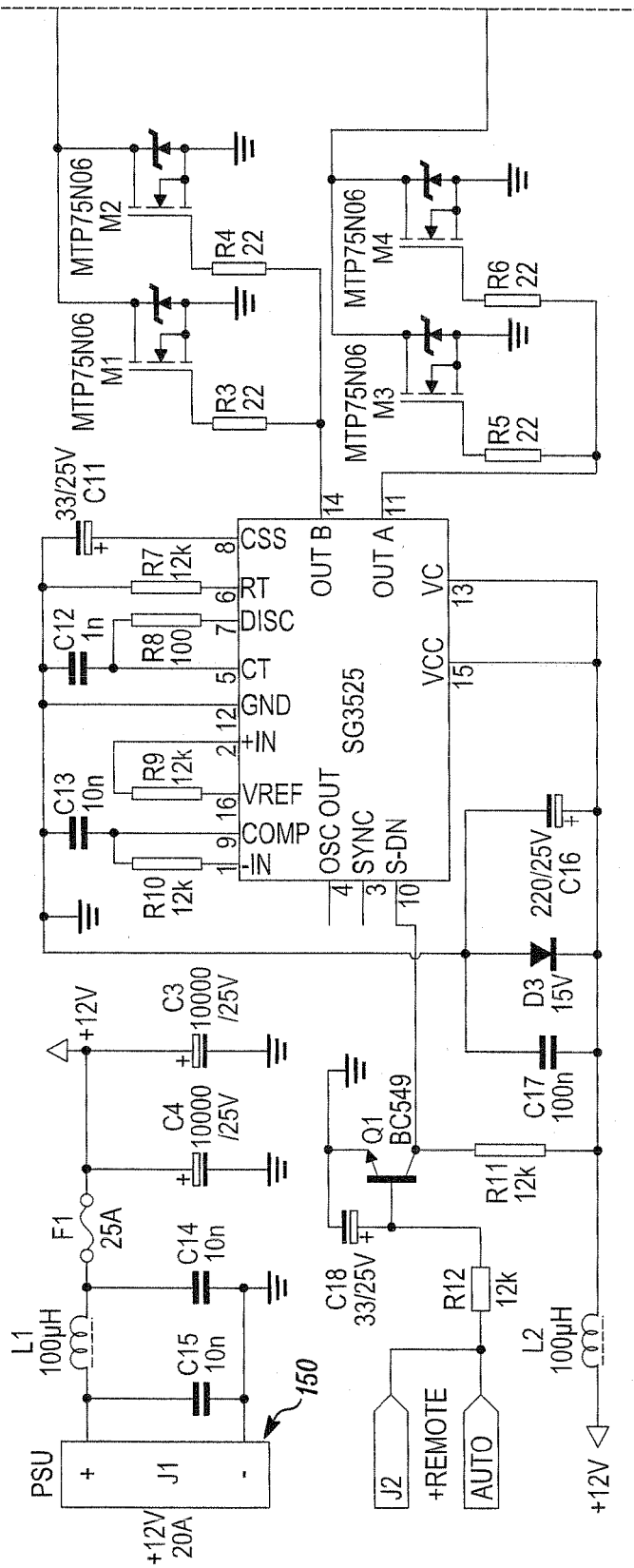
Figure 1E:
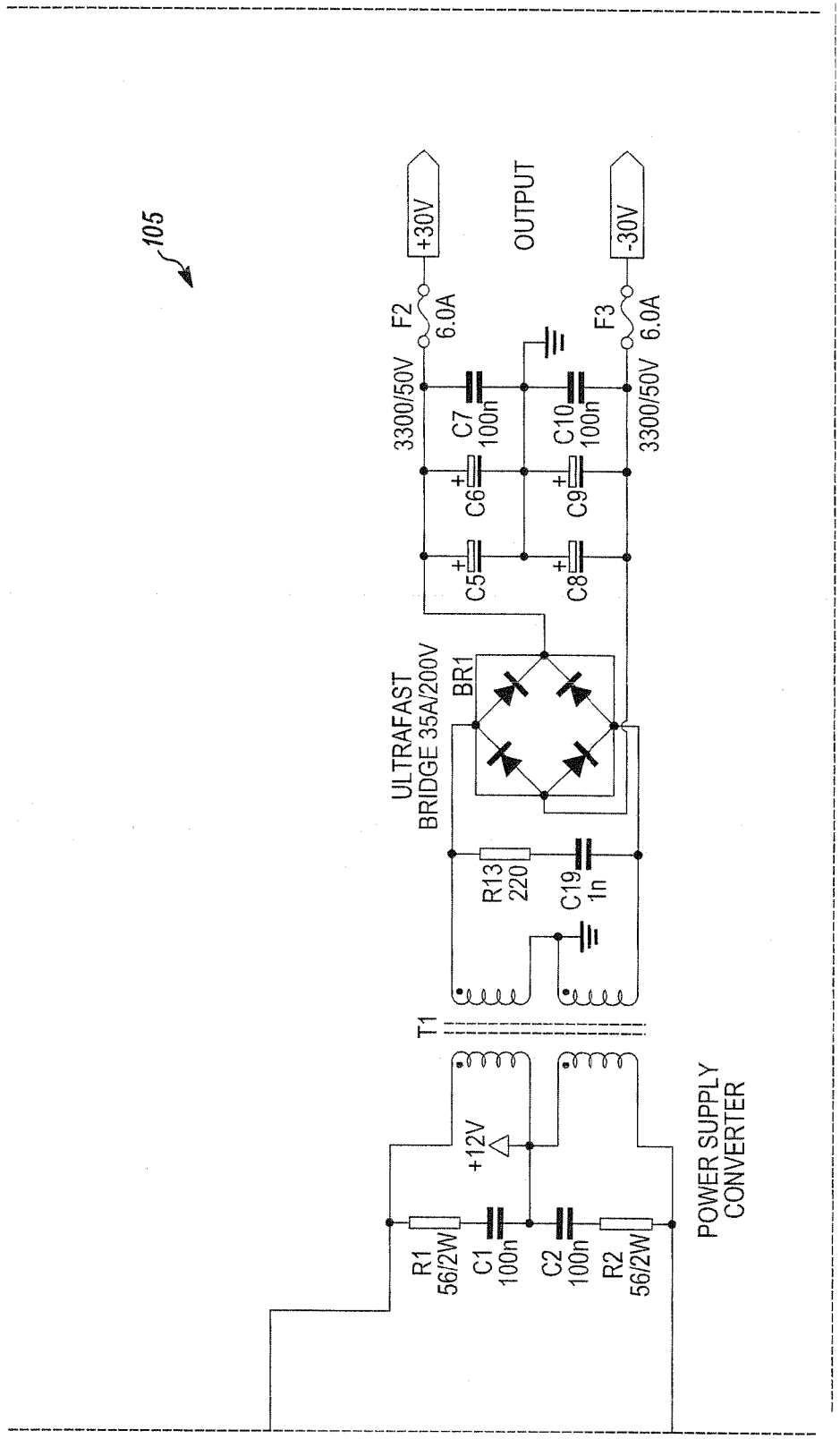
Figure 1E:
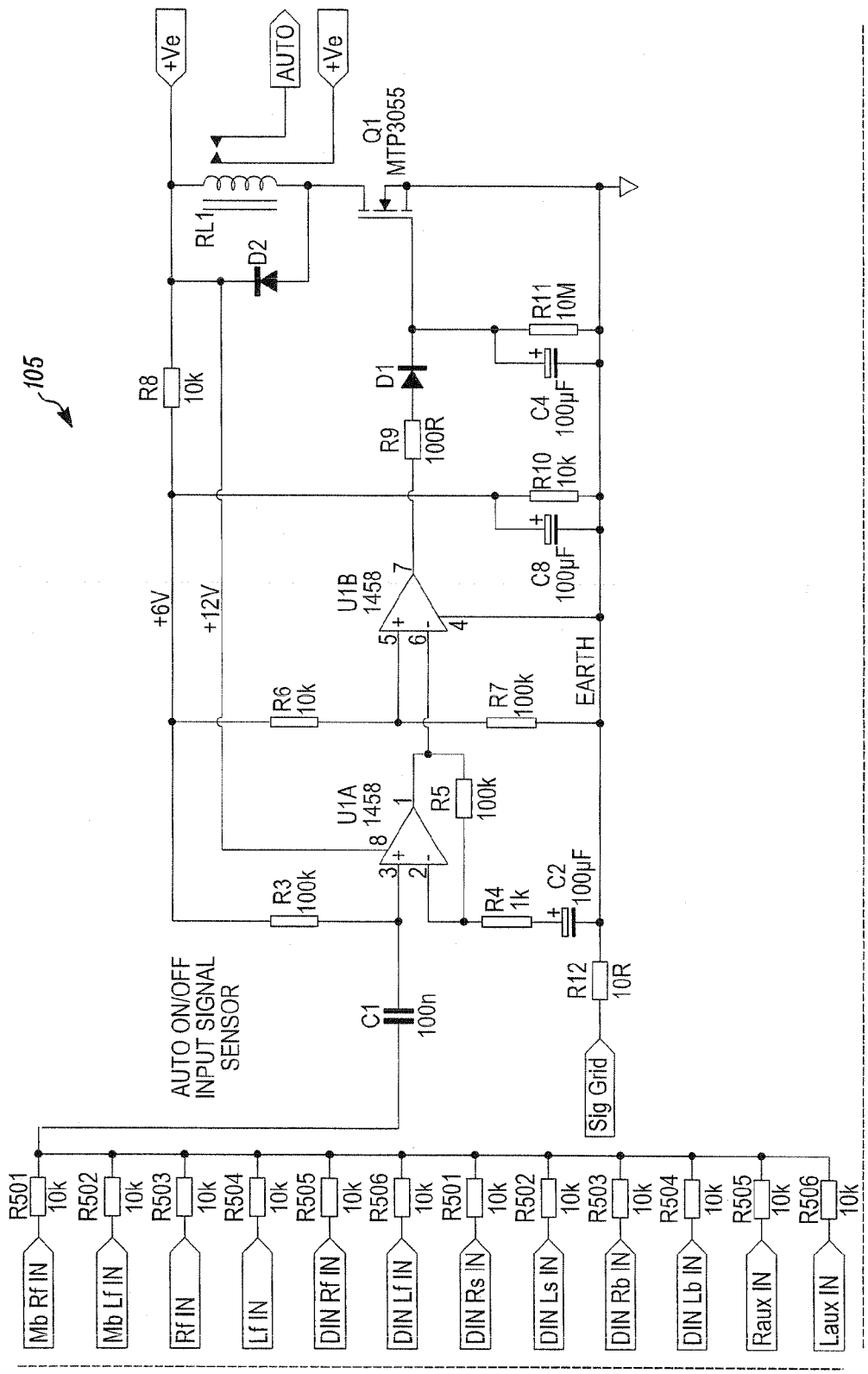
Figure 1E:
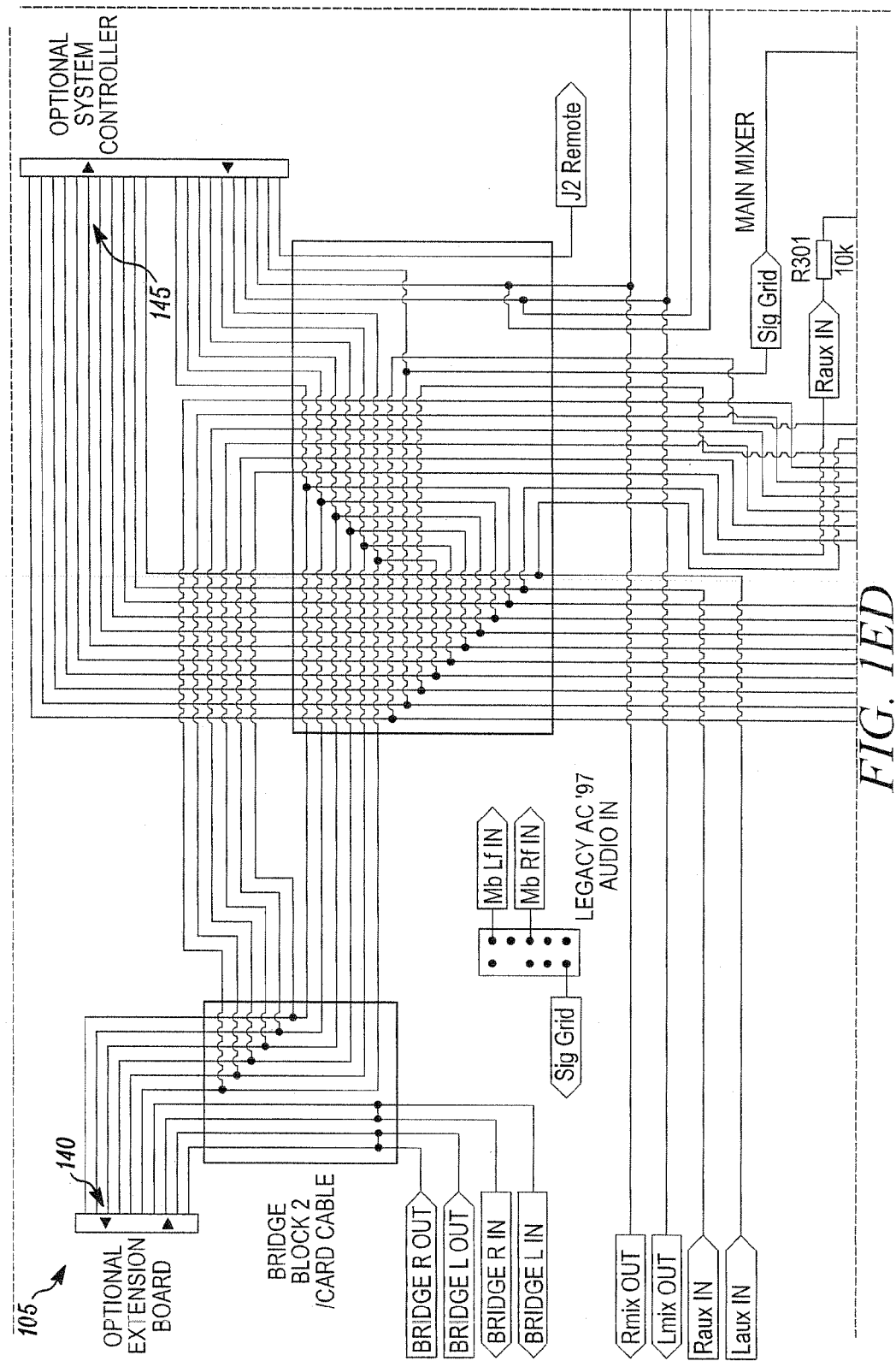
Figure 1E:
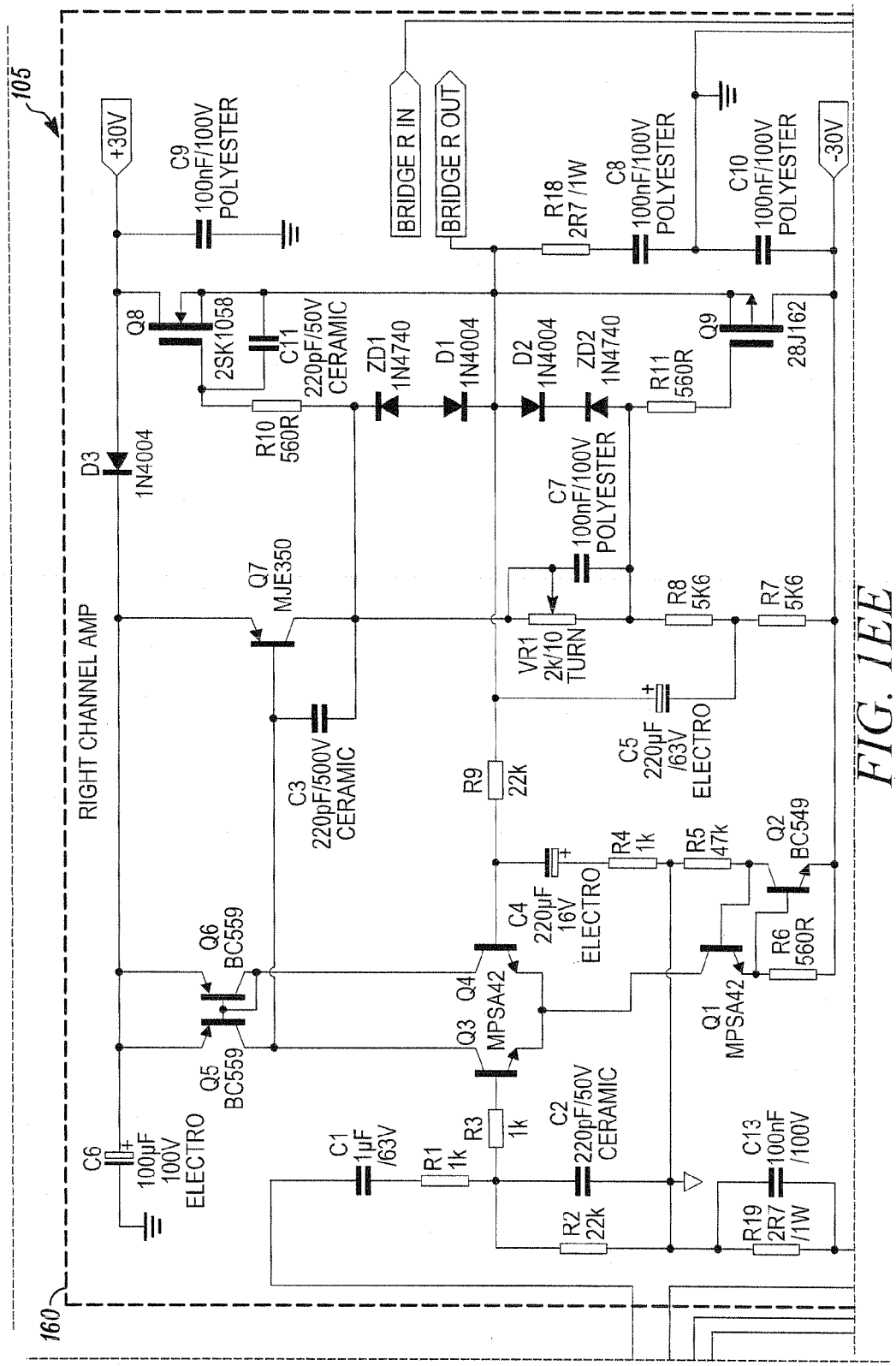
Figure 1E:
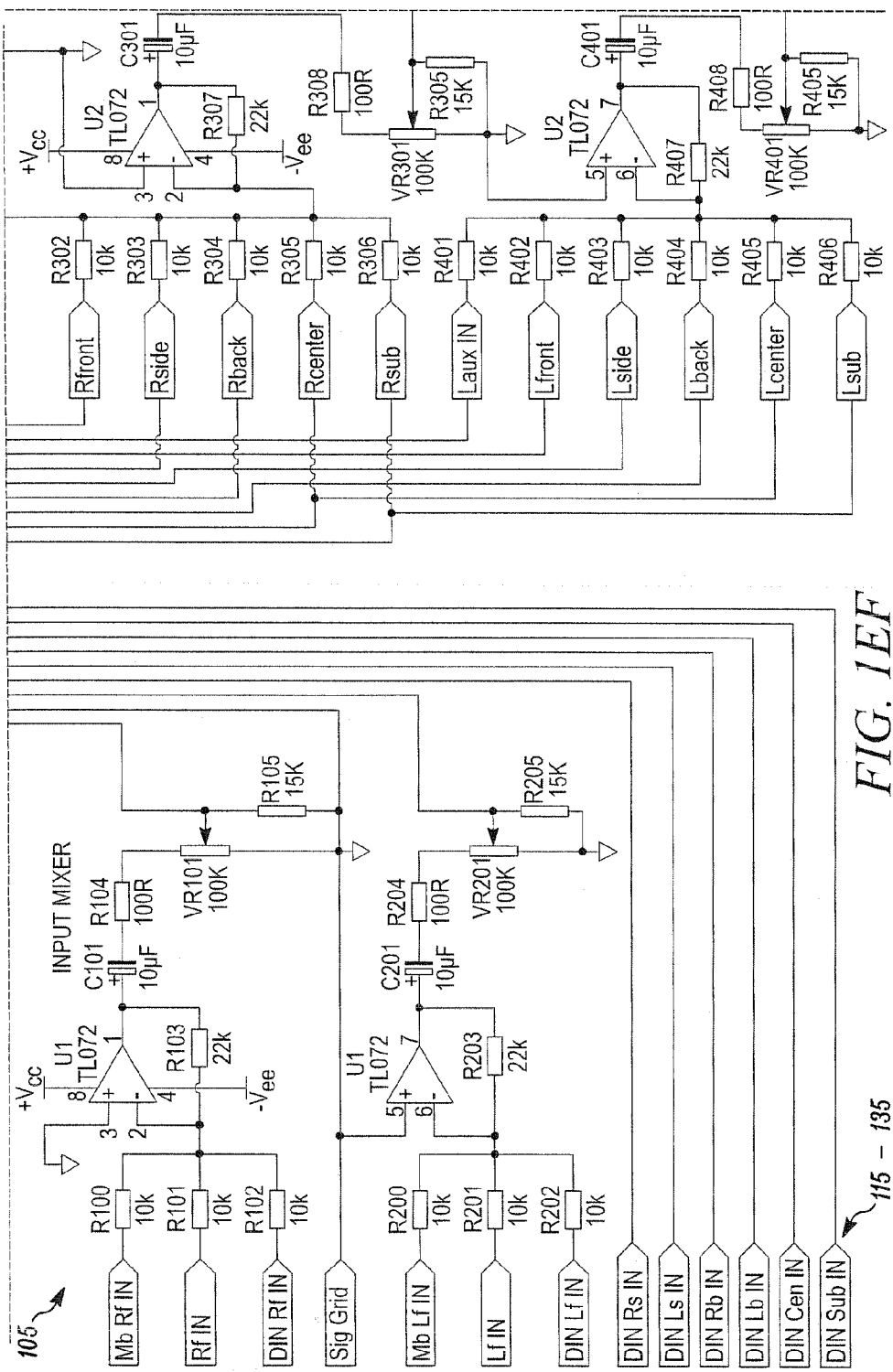
Figure 1E:
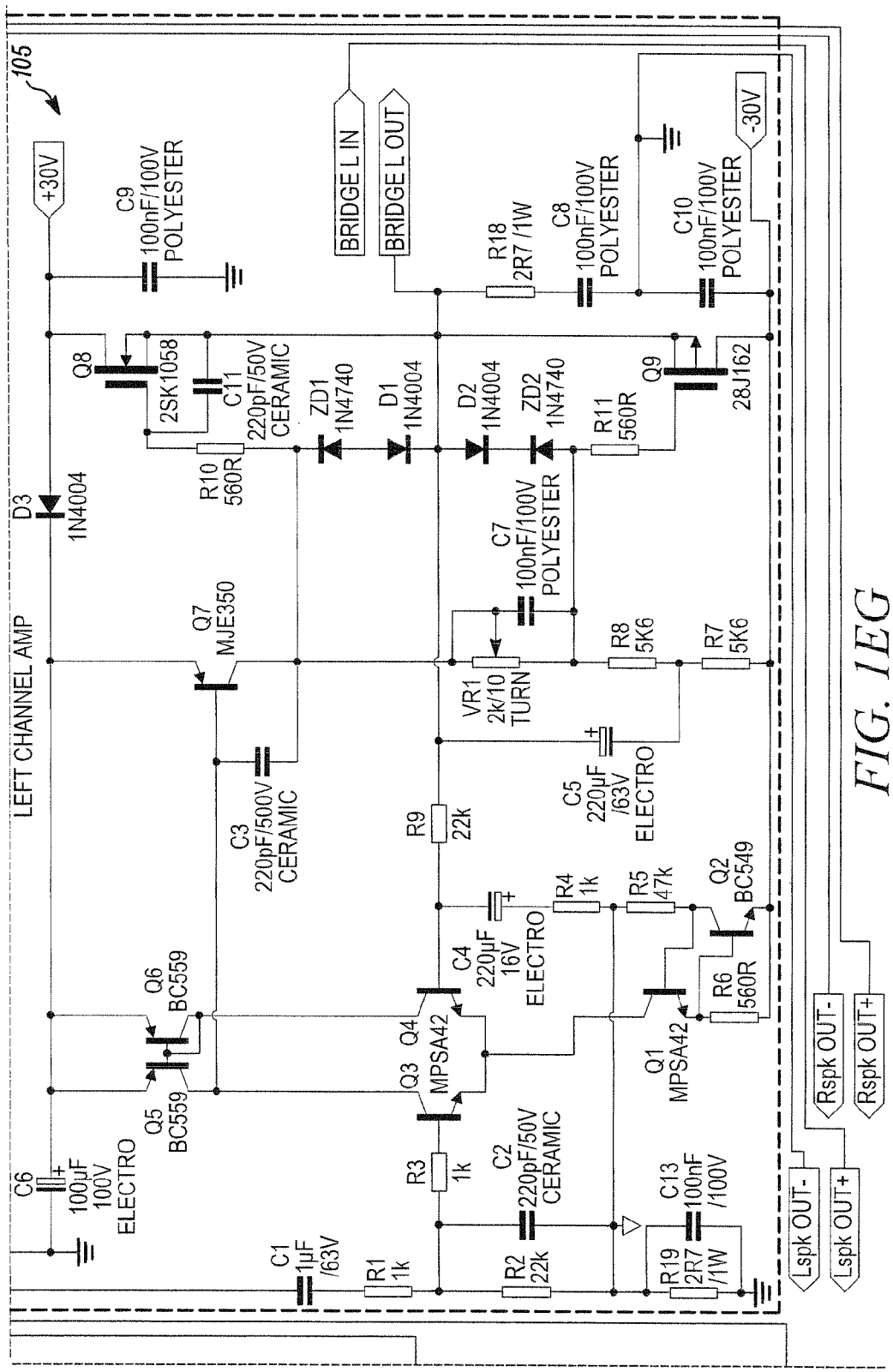

FIG. 1E illustrates amplifier circuitry, according to some embodiments. Amplifier circuitry 105 is operably connected to connectors 110A-110C, 115A and 115B, 120, 125A and 125B, 130, 135, 140, 145, and MOLEX 12V power supply input 150. Discrete lateral MOSFET circuitry 160 is shown and can include a digital channel router/mixer with auto-sense line-level inputs (+4 dBu or −10 dBV) that feed the discrete power amplifier 105 for delivering from about 50 W RMS up to about 150 W RMS output at about 20 Hz to about 20 Khz over two channels. The circuitry can comprise high-grade ±30V lateral MOSFETs (metal-oxide-semiconductor field-effect transistors) that are used on the output stage of the discrete power amplifier circuit.

In some embodiments, the amplifier card can function to receive and amplify audio data having frequencies that are outside of the range of normal hearing in a human. This function of the amplifier card can be implemented in the expansion card to add to a user's listening experience by providing a simulation of live sound through the addition of non-audible frequencies that are present in a live performance and produce sensations other than audible sound. Such sensations complement a traditional, recorded, non-live "listening" experience. One of skill will appreciate that human auditory senses are capable of hearing sounds in the range typically from 20 Hz to 20 kHz. However, one of skill will also appreciate that the human senses are capable of perceiving (i) subsonic frequencies ranging from about 1 Hz to about 20 Hz and (ii) ultrasonic frequencies ranging from about 20 kHz to about 250 kHz, and many live sounds, such as musical instruments, can generate subsonic and ultrasonic harmonics that can be perceived by users. In some embodiments, the amplifier card can amplify subsonic frequencies, ultrasonic frequencies, frequencies in the range of normal hearing by a mammal, either independently or as a combination thereof.

In some embodiments, the amplifier card functions to receive and amplify audio data having a frequency from about 10 Hz to about 100 kHz, from about 20 Hz to about 20 kHz, from about 1 Hz to about 20 Hz, from about 20 kHz to about 250 kHz, or any range therein.

In some embodiments, the amplifier card can have audio mixing functionality for splitting mono audio into at least two audio channels or combining more than two audio channels into two audio channels. For example, a user can sing and play guitar on top of music obtained from compact disc, do so for mere entertainment, or do so for purposes of music production and/or learning. In some embodiments, the amplifier card can have audio routing functionality for splitting audio into more than two audio channels. It should be appreciated that the term "splitting" can be interpreted broadly to mean a duplication of an audio data stream or a division of audio data.

In some embodiments, the amplifier card functions to provide a multi-level input data processing that auto-senses all common input audio data. The common input audio data can include, but is not limited to, data from transducers ranging from about 1 mV to about 20 mV, from line-level home audio having about +4 dBu, from line-level studio audio having about −10 dBV, and from low-level speaker audio ranging from about 1V to about 18V. The multi-level input data processing auto-senses, converts, and amplifies the audio data to passive speaker power automatically. The amplifier card can function, for example, to sense audio data at any input and activate all required system functions automatically. This function makes the amplifier card cross-compatible with most any type of audio input. Accordingly, in some embodiments, the amplifier card can automatically detect the presence of audio data and appropriately isolate or mix the data for amplification relative to the configuration of the amplifier card. For example, the amplifier card can comprise a digital channel router/mixer with auto-sense line-level inputs (+4 dBu or −10 dBV) that supply a discrete power amplifier capable of delivering an output power over two channels ranging from about 20 W RMS up to about 150 W RMS and having a frequency ranging from about 10 Hz to about 100 kHz, from about 20 Hz to about 20 kHz, or any range therein.

In some embodiments, the amplifier card provides a quick-fade and soft-mute function that fades volume up or down over a time ranging from about 1 second to about 5 seconds, from about 2 seconds to about 4 seconds, from about 1 second to about 3 seconds, from about 2 seconds, to about 3 seconds, or any range therein, for a smooth transition between volume levels. In addition, in some embodiments, the amplifier card provides a volume normalizer for controlling the audio output level at a constant, or substantially constant level, to avoid sharp transitions in sound levels such as, for example, the sharp audio volume transitions between television programs and commercials placed at intervals within the television programs.

The teachings include a multimedia system comprising the amplifier card described above and a studio controller operably connected to the amplifier card for receiving and processing input audio data. The studio controller can comprise a receiver of audio data from one or more sources; a mixer of the audio data from the one or more sources; state selectors for controlling audio data input and output; and, a field-programmable-gate-array (FPGA) or application-specific-integrated-circuit (ASIC) microprocessor. Examples of such multimedia systems include, but are not limited to, a television home entertainment system, an audio home entertainment system, a music production studio system, a gaming system, a personal computing system, or any combination thereof.

Figure 2:
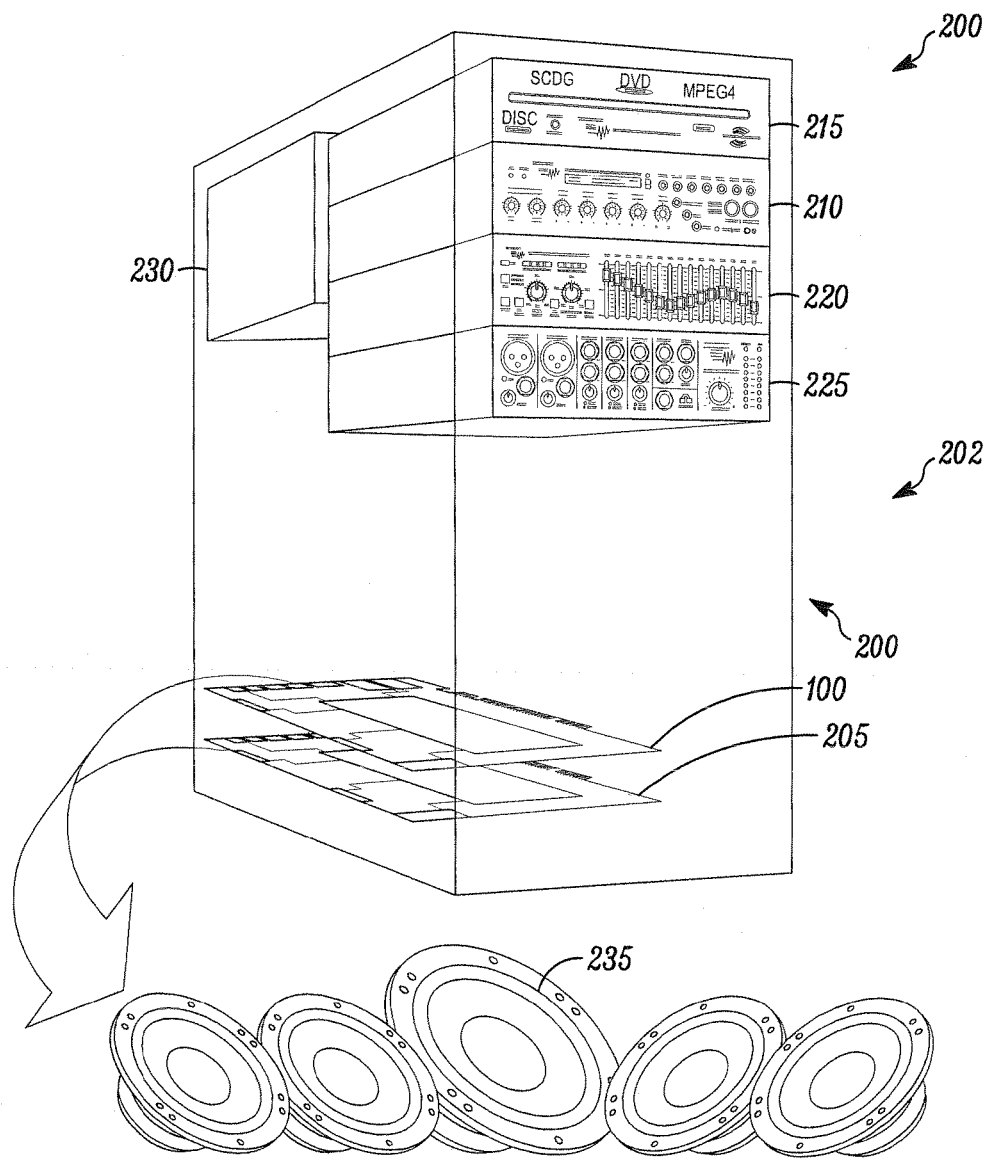
FIG. 2 illustrates a desktop computer system comprising the amplifier card, according to some embodiments.

FIG. 2 illustrates a desktop computer system comprising the audio power amplifier expansion card, according to some embodiments. Computer system 200 comprises case 202, amplifier card 100, extension card 205, studio controller 210, DVD/CD multi-disc component 215, graphic equalizer 220, instrument mixer 225, power supply unit 230, and passive speaker system 235. Case 202 can be a standard ATX type computer case with amplifier card 100 and extension card 205 included to provide five channels of passive speaker power. The power amplifier system can work in conjunction with the system components to produce high-power professional recordings with production studio quality in a single computer case. The extension card 205 can be designed to provide any of a range of power and accommodate all popular speaker arrangements such as, for example, stereo, 5.1 surround-sound, or 7.1 surround-sound. See FIGS. 4A and 4B discussed below. In some embodiments, the system is fully multimedia and can also include, for example, an HDTV tuner.

In some embodiments, the case 202 can be any desktop computer case or tower that is capable of housing a motherboard, a power supply unit, any number of 5.25" (or 3.5") drive bay components, any number of data storage devices, such as hard drives, as well as peripheral component assemblies and/or expansion cards. It should be appreciated that the case 202 can be altered, modified, or replaced by any other chassis design that will accommodate the components that one of skill will understand to be necessary to implement the general nature of the teachings set-forth herein.

In some embodiments, the amplifier card 100 is operably connected to the extension card 205. In some embodiments, the extension card 205 can provide additional speaker power and channels for emulation of 5.1 surround sound. In some embodiments, the extension card 205 can provide additional speaker power and channels for emulation of 7.1 surround sound. Generally, the extension card 205 provides flexibility in the design of a system by adding the option to fully power two passive speaker channels for stereo, five passive speaker channels for 5.1 surround-sound, or seven passive speaker channels for 7.1 surround-sound.

The amplifier card 100 and extension card 205 can comprise, alone or combination, discrete amplifier circuitry. Additional speaker power and channels can be provided through this configuration for 5.1 surround-sound. The additional channels can be bridged back to the amplifier card 100 for ultra-high stereo power by a board jumper, if desired. The subwoofer/center channel can be set for low frequency or full range monolithic frequency output by a board jumper as well. If no subwoofer/center speaker is present, the channel can be automatically turned off by a switch in the ⅛" phone plug output port or through the use of the auto-sense technology discussed herein. In addition to insuring the subwoofer/center channel transistor is not unnecessarily powered when it is not in use, this feature also adds more full frequency power to the left and right channels. It should be appreciated that, in some embodiments, the extension card 205 can be altered, modified, or replaced by changing the output amplifiers from MOSFET type power amplifier transistors to an integrated type power circuit. In some embodiments, IC-type power amplifier chips such as, for example, LM3876 or LM3886 audio power amplifier integrated circuit chips available from National Semiconductor, Santa Clara, Calif., can be used.

In some embodiments, a studio controller 210 is included in the system. The studio controller 210, for example, can be designed to fit into an open 3.5" drive bay or 5.25" drive bay of any desktop computer tower. The user is provided with ergonomic control of all of the fundamental amplifier functions through the studio controller 210 such as, for example, channel mix, volume, balance, and tone functionalities. In some embodiments, model options may add front panel instrument inputs, which can be used for an artist's instruments including, but not limited to, an electric guitar, keyboard, or microphone. The instrument input may have sound processing controls and effects like gain, overdrive, tone, chorus, distortion, reverb, and delay, or any number of other digital effects, in some embodiments.

In some embodiments, the studio controller may also act as a radio tuner, data receiver and mixer, as well as incorporate the convenience of a card-sized remote control that will allow users to control all aspects of the studio controller from remote locations. It should be appreciated that the studio controller can be altered, modified, or replaced by changing or adding any of the audio data processing functions listed above. All I/O connections can also be changed to any number of model connectors.

In some embodiments, the studio controller can provide all of the primary functions of a three channel mixer, a radio tuner, and pre-amp receiver head. The studio controller can be designed to interface with an eject-slot DVD/CD±RW Multi-Disc player, in some embodiments, having Karaoke voice-cut technology, a studio grade multi-band graphic equalizer having TV volume-normalizer technology, and a studio grade multi-channel mixer. In some embodiments, the studio controller has an intelligent auto-sense technology for full control and functionality of the studio controller and all connected system devices, and this control can be in place without powering-up the operating system of the computer.

In some embodiments, a DVD/CD multi-disc component 215 is included in the system. The DVD/CD multi-disc component 215 can be any such player that will play audio files, and it can also have full read-write functionalities. The studio controller 210 may accept data, such as video and/or audio data, from the disc player for processing by the amplifier card 100. It should be appreciated that the DVD/CD multi-disc component 215 can be altered, modified, or replaced by the changing disc type that the player will read, write and/or play. The DVD/CD multi-disc component 215 may also incorporate Karaoke voice cut technology that filters out human voice frequencies from digital audio files, and/or auto-start if a music CD is inserted into the player.

In some embodiments, a graphic equalizer 220 is included in the system. For example, the graphic equalizer 220 can be any type of multi-band frequency equalizer manufactured to fit into the form factor of a 5.25" or 3.5" drive bays of a desktop computer. The studio controller 210 may send and receive audio data to and from the equalizer 220, so they can be processed by the amplifier card 100. It should be appreciated that the graphic equalizer 220 can be altered, modified, or replaced by changing the number of frequency bands that the graphic equalizer 220 will filter. It may also be used to analyze an audio file in order to stabilize, limit and/or control the output power.

In some embodiments, the graphic equalizer can have the volume normalization technology as described above to analyze the audio data and (i) calculate the average volume power output and hold the output constant or relatively constant, to avoid volume surges, such as during commercial breaks within television showings; (ii) limit very high volume spikes relative to average volume to dampen the sometimes uncomfortably loud noises from events during television showings, such as explosions, crashes, gun fire, and the like; and (iii) boost low volume drops relative to average volume to raise the volume on low sounds and make them audible, such as whispering, or other low volume periods that may be due to a poor initial production or unstable transmission of the television showing.

In some embodiments, an instrument mixer 225 is included in the system. For example, the instrument mixer 225 can be any type of audio data mixer manufactured to fit into the form factor of a 5.25" or 3.5" drive bays of a desktop computer. The studio controller 210 may send and receive audio data to and from the mixer 225 for processing by the expansion card. It should be appreciated that the instrument mixer 225 can be altered, modified, or replaced by changing the number of inputs, and/or input types. It may also be used to patch-in external sound effects processors in order to further enhance any audio data being received.

In some embodiments, an HDTV tuner/HD DVR component (not shown) can be included in the system. The HDTV tuner/HD DVR component has volume normalization technology as described above and functions to analyze the audio data to (i) calculate the average volume power output and hold the output constant or relatively constant, to avoid volume surges, such as during commercial breaks within television showings; (ii) limit very high volume spikes relative to average volume to dampen the sometimes uncomfortably loud noises from events during television showings, such as explosions, crashes, gun fire, and the like; and (iii) boost low volume drops relative to average volume to raise the volume on low sounds and make them audible, such as whispering, or other low volume periods that may be due to a poor initial production or unstable transmission of the television showing. In some embodiments, the HDTV tuner/HD DVR component has a multizone audio amplification function for separating independent sources of audio data into multiple audio outputs. For example, a first user can watch television in a first room, while a second user plays video games in a second room. These independent audio outputs can be redirected to a desired zone by splitting them, flipping them, or merging them electronically through the HDTV tuner/HD DVR component.

While not intending to be bound by any theory or mechanism of action, it should be appreciated that the characteristics of the power produced by the system can depend on the power supplied to the system. In some embodiments, a power supply unit 230 is included in the system and, for example, can be any 12V DC reference to a source of sufficient electrical power. It should also be appreciated that the power supply unit can be altered, modified, or replaced by changing its form factor and/or by increasing or decreasing the power provided, so long as it is provided safely to the system. In some embodiments, the power supply unit has an advanced dual-transformer design with an isolated 12V rail that provides ultra-pure filtered voltage for use with high-end power amplifier systems. In some embodiments, an external power supply source may be desired or necessary to supply the amplifier card and/or an extension with needed power. In some embodiments, the amplifier card and/or extension card may draw needed voltage from an external power adapter.

The system, in most embodiments, can include a passive speaker system 235. In some embodiments, the passive speaker system 235 can include any type of passive speakers having from about 4 to 8 ohms resistance such as, for example, bookshelf speakers, reference speakers, or loudspeakers. It should be appreciated, however, that the amplifier card 100 can be designed to drive passive speakers, such that, in some embodiments, the passive speaker system 235 cannot be altered, modified, or replaced with other types of speakers. In some embodiments, all suggested peripheral components taught herein can be internally located within the form factor confines of a desktop computer system and are self-contained therein.

Figure 3A:
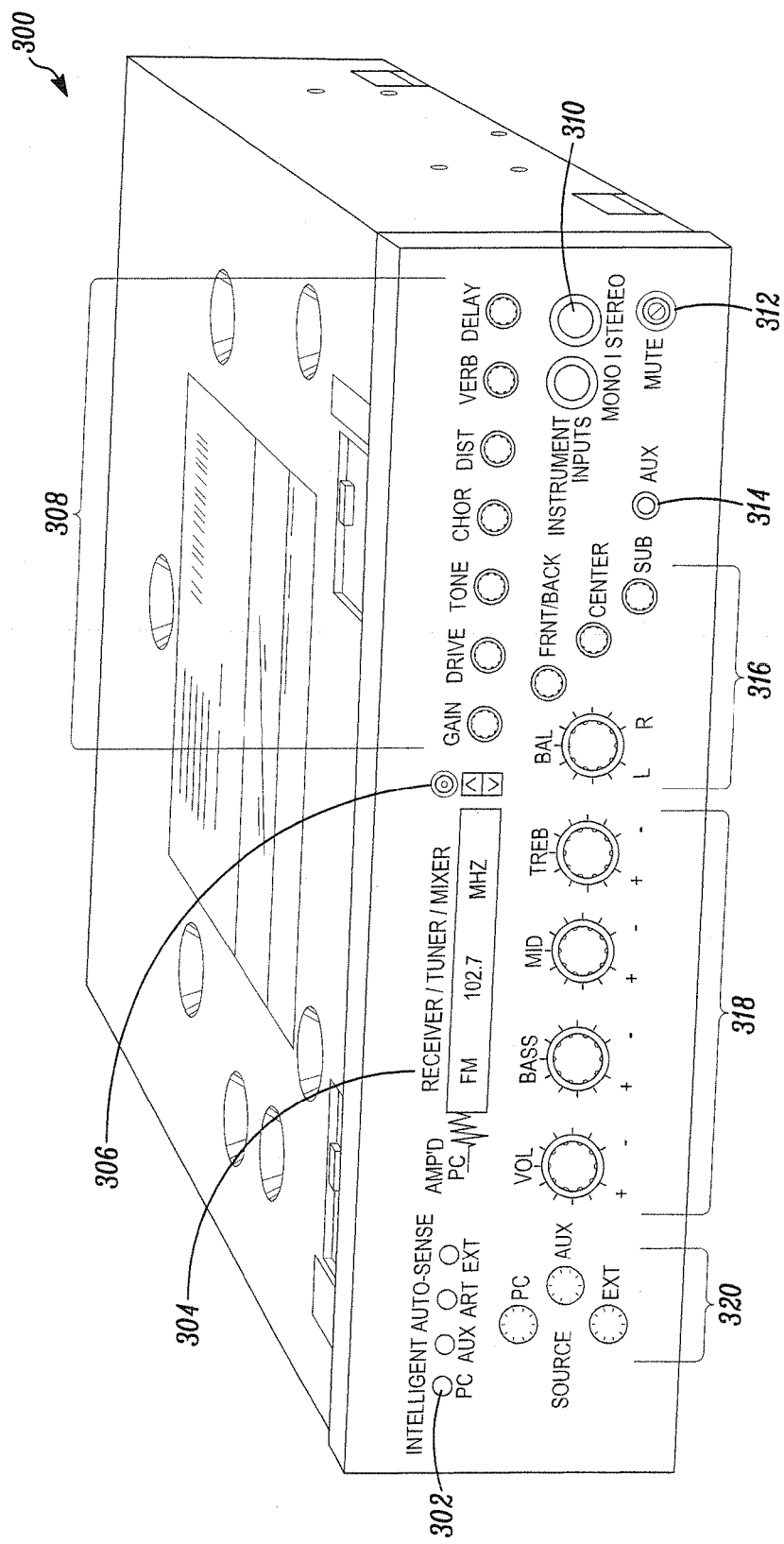
FIGS. 3A through 3E illustrate peripheral components for multimedia systems comprising the amplifier card, according to some embodiments.

FIGS. 3A through 3E illustrate peripheral components for multimedia systems comprising the amplifier card, according to some embodiments. FIG. 3A illustrates a studio controller 300. The studio controller 300 is an optional master control module for the amplifier card. The studio controller 300 can be a sub-component module receiver, an FM radio tuner, a multi-audio input mixer, and a musical instrument effects that provides control of all the fundamental audio functions prior to being amplified by the amplifier card such as, for example, audio input source level mix, volume, balance and tone. The intelligent auto-sense technology from the expansion card is operable from the studio controller 300, so all inputs are constantly monitored for the presence of any active audio data on all inputs. For example, if an electronic device, such as an iPod, is plugged into the auxiliary input; or, if an electric guitar is plugged into an artist input, the studio controller 300 and the amplifier card are automatically turned on to amplify the sound. As soon as either device becomes inactive, the studio controller 300 and amplifier card automatically turn off after a short period of time. These functions also apply to any audio data activity that may be produced by other optional sub-modules connected to the studio controller 300. In some embodiments, functions of the studio controller 300 can be selected and controlled with a class 1 BLUETOOTH remote control from remote locations of up to 300 ft away from the system.

The studio controller 300 can have intelligent auto-sense indicator lights 302 that show current active inputs of the controller. There are essentially three independent input source indicators. The first input source is connected the 1/8" stereo analog audio input on the amplifier card (the PC indicator). The second input source is connected to the RCA and 9 Pin Mini-DIN inputs on the amplifier card, plus the 1/8" stereo auxiliary input (the AUX indicator). The third input source is connected to the 1/4" Instrument Inputs (the ART indicator). FM tuner display 304 is an easy to read screen using a low-light liquid crystal display to show selected FM radio stations. If the FM tuner power and station selector 306 is turned off, a digital clock is displayed instead. The FM tuner audio data overlays in equal mix with all other inputs. For example, if the FM tuner power and station selector 306 is on, and a radio station is playing, the user can still simply plug in an electric guitar and play along with the radio. Multi-effects bay controls 308 are driven by a field-programmable gate array (FPGA) sound-effects array and sound-modeling engine for an unprecedented musical response having sound processing effects that include gain, overdrive, tone, chorus, distortion, reverb, and delay.

The front panel instrument inputs 310, both mono and stereo, can be used simultaneously for any common artist instruments such as an electric guitar, keyboard, or microphone. In some embodiments, the inputs 310 are 1/4" inputs. The input data are equally leveled and mixed, and can be laden with any combination or level of the ultra-clean digital effects as noted above.

The mute button 312 functions to mute the amplifier card's high-power passive speaker output. In some embodiments, the studio controller 300 comprises a quick-fade soft-mute functionality for smooth volume level transitions by panning the output levels from full-power to zero-power over a short preset period of time. This functionality reduces or eliminates popping, and works in reverse for un-muting the sound back to full volume.

The stereo auxiliary input 314 connects auxiliary audio equipment to the studio controller 300. In some embodiments, the input channels are equally mixed through a 1/8" stereo analog audio input on the amplifier card, both of which can also be adjusted using a source level mix (PC/AUX) discussed below. Intelligent auto-sense technology can be used to monitor for the presence of active data on the input and turn the studio controller 300 and amplifier card on or off, accordingly. For example, a user can plug-in an MP3 player, turn the MP3 player on, and the intelligent auto-sense smoothly delivers a full power home theater sound.

The speaker balance controls 316 are state selectors for setting speaker channel output levels relative to both the amplifier card and any optional extension cards. If the amplifier is standing alone, only the balance (BAL) knob is active. If an extension card is present, Front/Back, Center and Subwoofer controls become active. The Front/Back knob is for balancing of available channels. The Center knob boosts/cuts frequency ranges, for example, from about 40 Hz to about 20 kHz mono, for use with a center speaker. The Subwoofer knob boosts/cuts frequency ranges, for example, from about 20 Hz to about 200 Hz mono for use with a subwoofer speaker.

The master volume and tone controls 318 are state selectors for setting the master volume and tone of audio output. These ergonomic controls can be in a non-intrusive low-profile position, or they can pop-out for convenient adjustment of all fundamental audio attributes. The master volume and tone controls 318 have no effect on the Instrument Inputs, as they are controlled independently with multi-effects bay controls 308.

The PC and auxiliary source level controls 320 are state selectors for setting the input level mix between, for example, an 1/8" stereo analog audio input for a PC and all other auxiliary (AUX) audio inputs. These knobs essentially boost and/or cut active channel levels relative to each other, creating the ability to mix multisource sound tracks.

Figure 3B:
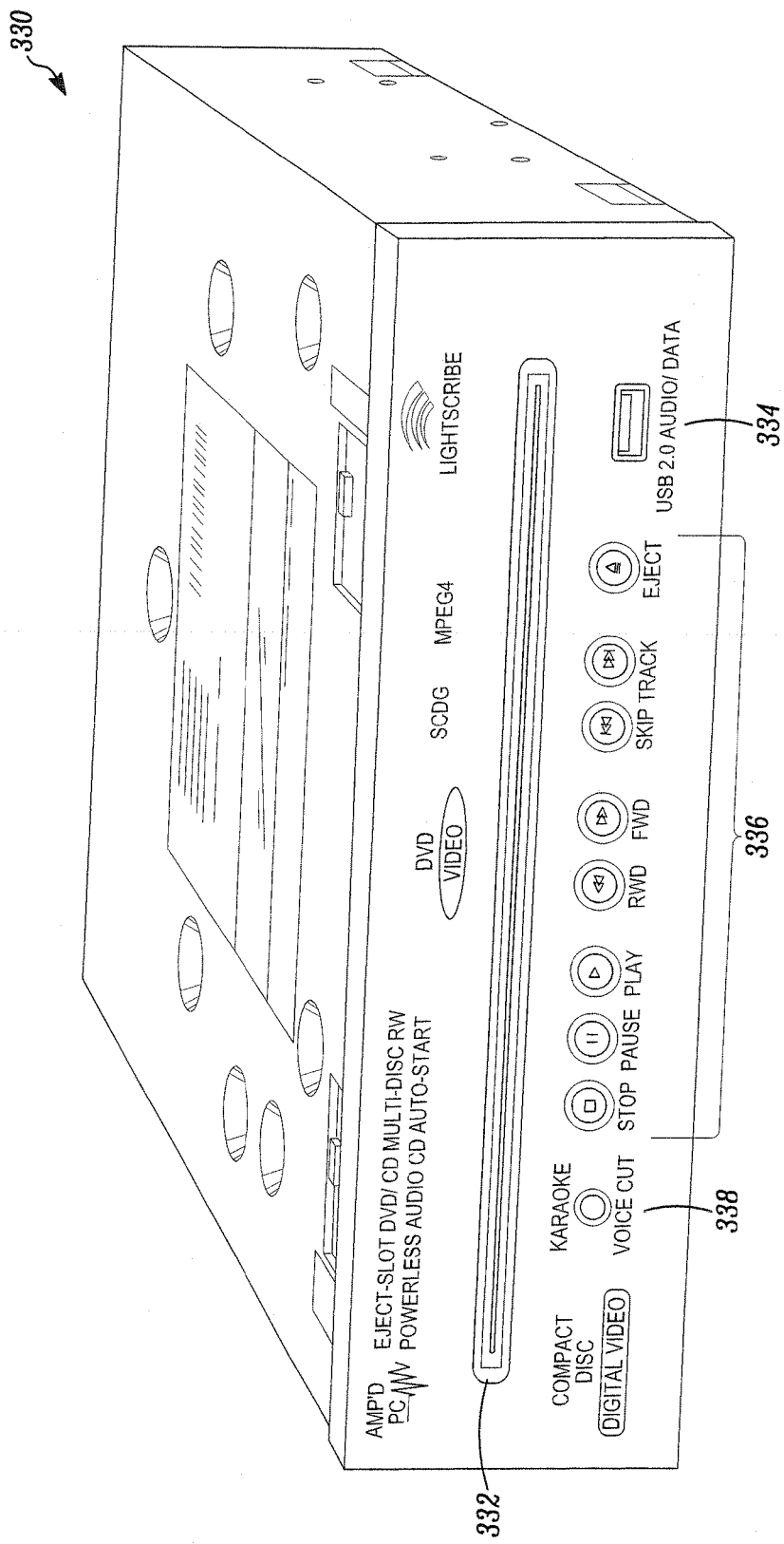

FIG. 3B illustrates a dual-function eject-slot DVD/CD multi-disc player. DVD/CD multi-disc player 330 is an optional sub-component module for the studio controller.

Compatible disc formats can include, but are not limited to, CD, CDM, CDG, CDGM, SCDG, VCD, DVD, CD-R, CD-RW, DVD+R/RW, Dual Layer DVD±R/RW. The dual-function technology of the disc player allows it to operate (i) by command of the studio controller or (ii) by the command of the PC. In some embodiments, the DVD/CD multi-disc player 330 has a powerless audio CD auto-start technology to read most audio and karaoke discs without powering up the PC. For example, if an audio or karaoke CD is inserted into the player, it automatically turns on the amplifier system, determines the type of disc it is, then smoothly delivers full power home theater sound. If the PC is powered up, all data, audio or otherwise, gets routed to the PC like a standard disc player, which could then be picked up by the amplifier card's ⅛" stereo analog input (PC) and get equally amplified to full power home theater sound. The DVD/CD multi-disc player 330 is an extension of the studio controller, and when connected, it becomes a single, expanded compact unit. The audio channels from both a compact disc or a USB 2.0 audio input, for example, are considered as auxiliary inputs by the studio controller and are monitored by intelligent auto-sense technology for any active data on the inputs to provide amplified sound for a user.

Disc eject-slot 332 can be a high-quality eject-slot design that quickly and quietly manages disc position. USB 2.0 audio/data input 334 connects to other audio/data equipment like iPods, MP3 players, or other external USB audio devices for full power home theater sound. If the PC is powered up, this input is treated like a standard high-speed USB 2.0 data port. The audio-CD controls 336 are state selectors that can be in the form of soft-touch ergonomic control buttons for playing audio CD's with or without BLUETOOTH remote control through the studio controller. The karaoke voice-cut button 338 is a state selector that can be in the form of a soft-touch control button to cut the voice frequency from Karaoke type CD's to produce music without vocals for sing-along entertainment. Compatible karaoke disc formats include, but are not limited to, CDM, CDG, CDGM and SCDG.

Figure 3C:
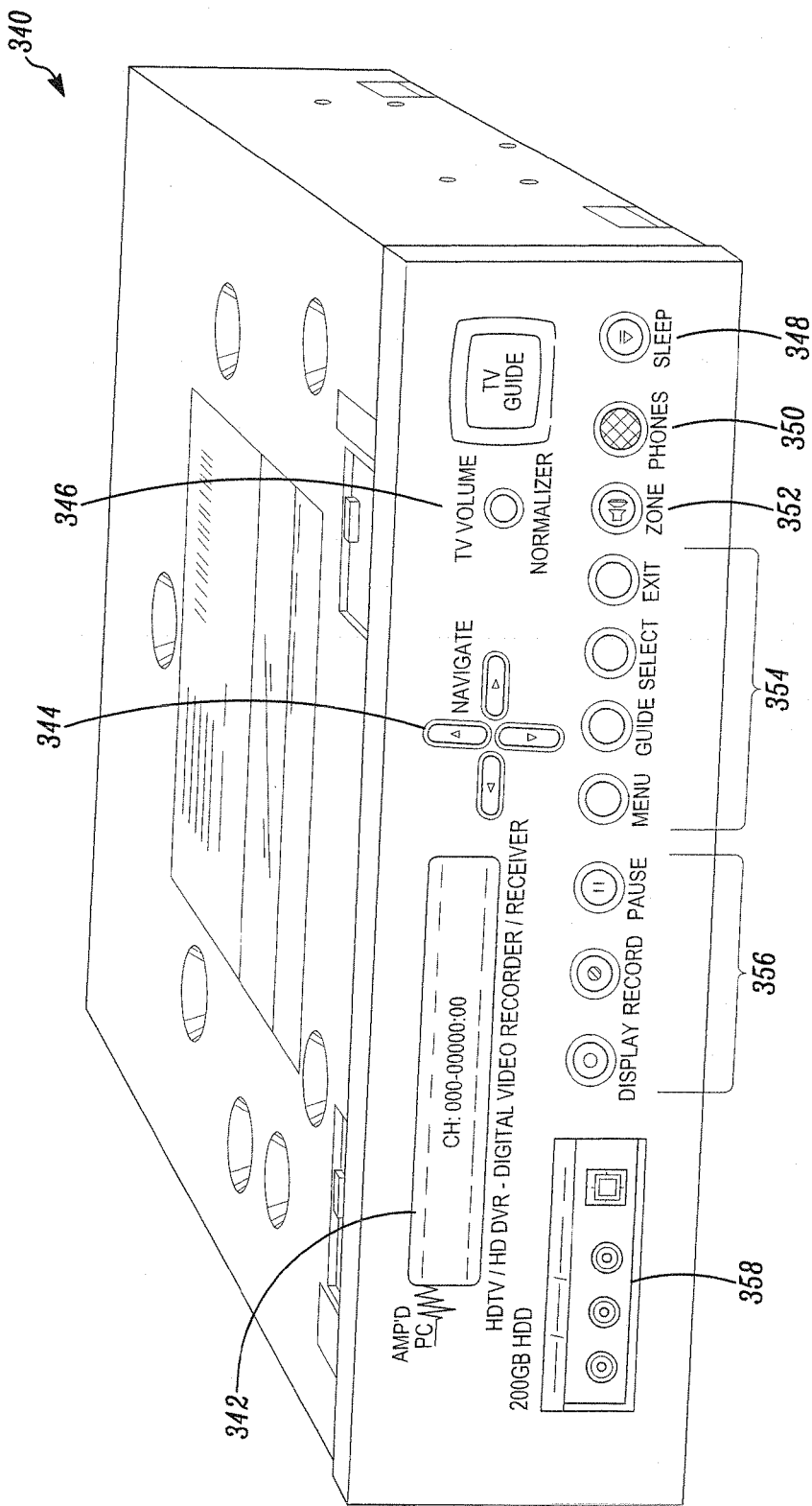

FIG. 3C illustrates an HDTV tuner/HD DVR player. The HDTV tuner/HD DVR 340 is an optional sub-component module for the studio controller and can provide high resolution reception, for example, two mega pixels HDTV reception with an aspect ratio of 16:9 (six times the resolution of regular TVs). The HDTV Tuner/HD DVR unit can provide both DVI-HDTV and RGB monitor outputs on a cable-connected expansion card. The rear access connector panel, also accommodates an additional set of audio, video and optical inputs. An HDTV/DVR display screen 342 displays current control settings of the TV tuner and video recorder. Navigation controls 344 are state selectors for on-screen television menus and system settings and preferences. A TV volume normalize 346 controls audio volume levels, such as by preventing commercials from being louder than the television show, and also be lowering moments of extreme loudness while boosting extreme low volume moments that may otherwise be hard to hear. A sleep button 348 is a state selector that puts the system to sleep. A stereo headphone jack 350, for example, a ¼" stereo headphone jack, is used to connect to headphones for private listening. When headphones are connected, the sound from the TV/DVR is not amplified to speaker outputs and can only be heard through the headphones.

Zone button 352 is a state selector that cycles through 3 settings of multizone audio amplification technology, which routes audio data in different directions as independent outputs, for example, into different rooms if an optional extension card is connected to the system. This technology provides the ability to separately amplify two independent sources of sound from multiple audio outputs. For example, a user can watch TV in one room, while another user plays a video game in another room. The dual independent outputs can be split, flipped or merged by the press of the ZONE button 352. The TV guide buttons 354 are state selectors that control and adjust the on-screen TV guide settings. The MENU button shows the main menu on the screen. A user can return to normal viewing by pressing the EXIT button. The GUIDE button shows station and program information on the screen. To remove the banner, the user presses the button again. If the main menu is displayed, pressing the SELECT button will activate the highlighted MENU option. If the SELECT button is pressed while in normal viewing, the channel banner will be displayed. The EXIT button clears all on-screen displays and returns to normal viewing from any menu. The display/record/pause buttons 356 are state selectors that set the output resolution to 1080i, 720p, 480p, or 480i formats and choose the correct display format for your TV or monitor. The RECORD button activates instant digital recording. To stop recording, press the RECORD button again. The PAUSE temporarily pauses live recording. The video/audio/optical inputs 358 connect to popular gaming machines and video camera's for on-screen display of any video content accompanied by home theater quality amplification of the sound.

In some embodiments, a user can schedule and record scheduled programs, record the HD programs to a hard disk such as, for example, a 200 GB hard-drive having up to 180 hour record time. The user can also pause live TV with the one-touch time-shift recording. The time-shift recording will be activated and the broadcast is then recorded for later viewing by pressing "PLAY", "REW", or "FF" to watch the program. Then, the user can press "STOP" to return to the live broadcast. The time-shifted program content will appear on the program list. Using the time-shift recording a second time, the previously cached time-shift segment is deleted. Other features include the ability to seek a scene using the DRAG +/− feature, and during playback, use SKIP (+/−) to skip to the next/previous scene. Recordings can be saved to DVHS (Digital VHS) and stored on an external DVHS recorder or MV Camcorder.

Figure 3D:
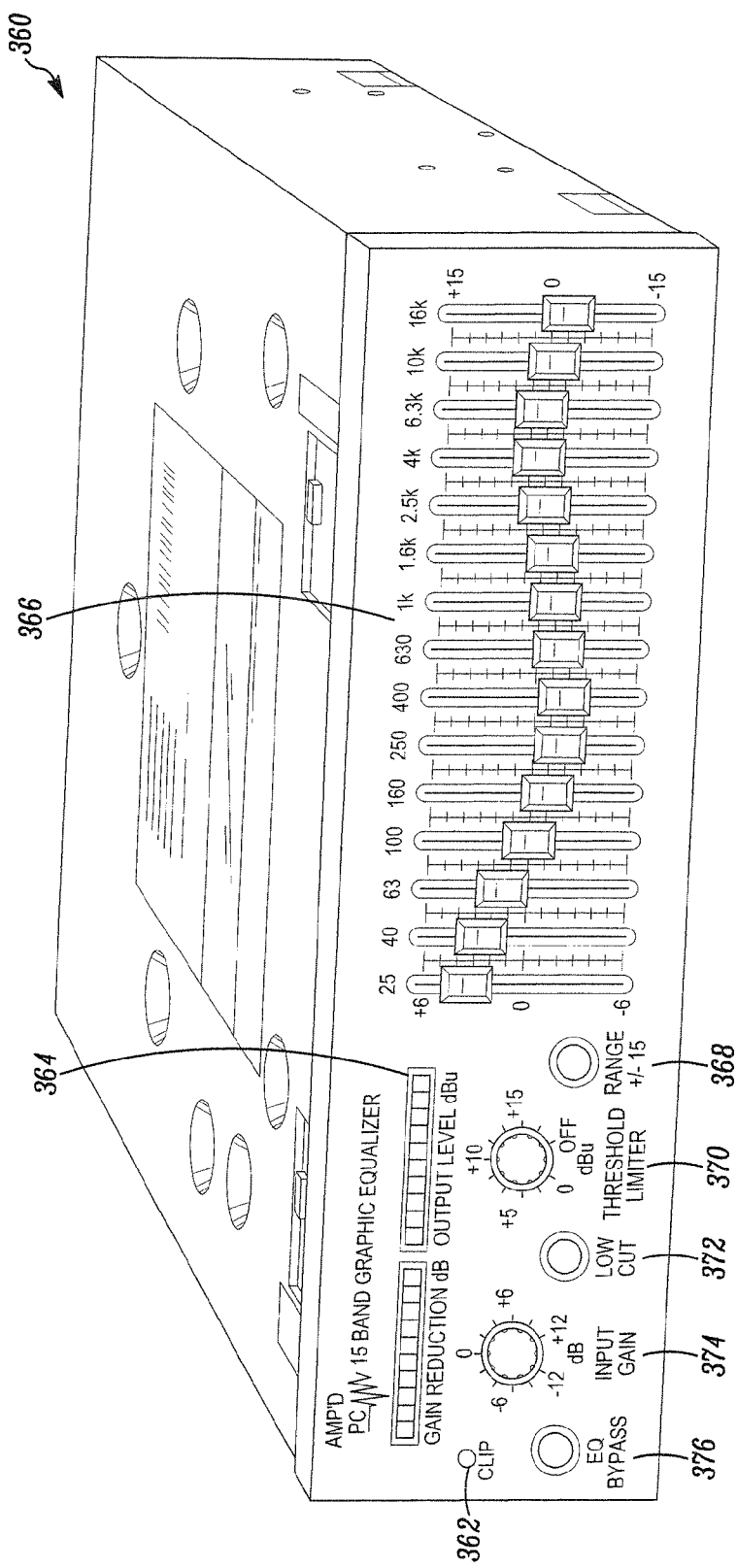

FIG. 3D illustrates a graphic equalizer. One of skill will appreciate that variety of audio bands can be split for control with a graphic equalizer. The graphic equalizer 360 controls 15 bands and includes all the fundamental aspects of a professional graphic equalizer, such as input gain, threshold limiter, EQ bypass, low cut, and range cut/boost. In some embodiments, the graphic equalizer has non-conductive nylon sliders and an intuitive user interface with comprehensive output and gain reduction metering.

Clip LED 362 lights up whenever any internal audio data level reaches 1 dB below clipping which may occur when any of the following happens: 1) the input data is "hotter" than +20 dBu, 2) excessive gain is applied by the input gain control, or 3) excessive boost is applied using the frequency sliders. The level meters 364 indicate the output level of the graphic equalizer 360. Levels are monitored at the output of the equalizer after all other processing, including the limiter. The Gain Reduction Meter 364 indicates the amount of gain reduction being induced by the setting of the threshold limiter control 370 as the data level from the graphic EQ section exceeds this setting.

The slider controls 366 control the frequency bands, and each one of these slider potentiometers boost or cut at its noted frequency by ±6 dB or ∓15 dB, depending upon the position of the Range ±15 button 368. When all the sliders are in the center position the output of the equalizer is flat. The frequency band centers of the equalizer are marked at two-thirds octave intervals on ISO standard spacing's. The range ±15 button 368 is a state selector for choosing which of the two boost or cut ranges the equalizer will use, either ±6 dB or ±15 dB. The button lights red when the ±15 dB range is selected. The limiter threshold control 370 sets the threshold level at which ∞:1 gain reduction will begin to occur. It is capable of a range of 0 dBu through "OFF" (+20 dBu). When the threshold control 370 is set to "OFF", the limiter is effectively disabled, and no gain reduction will occur. The low-cut button 372 is a state selector that inserts or removes the 18 dB/octave 40 Hz Bessel low-cut filter from the data path. When the button 372 is pushed in, the low-cut filter is inserted into the audio path. The input gain control 374 is a state selector that sets the data level to the equalizer 360. It is capable of −12 dB to +12 dB of gain. Its effect is apparent by viewing the Output Level Mete 364. The EQ bypass button 376 is a state selector that removes the graphic equalizer section from the data path. The Bypass button does not, however, affect the input gain 374 or low cut 372 filters.

Figure 3E:
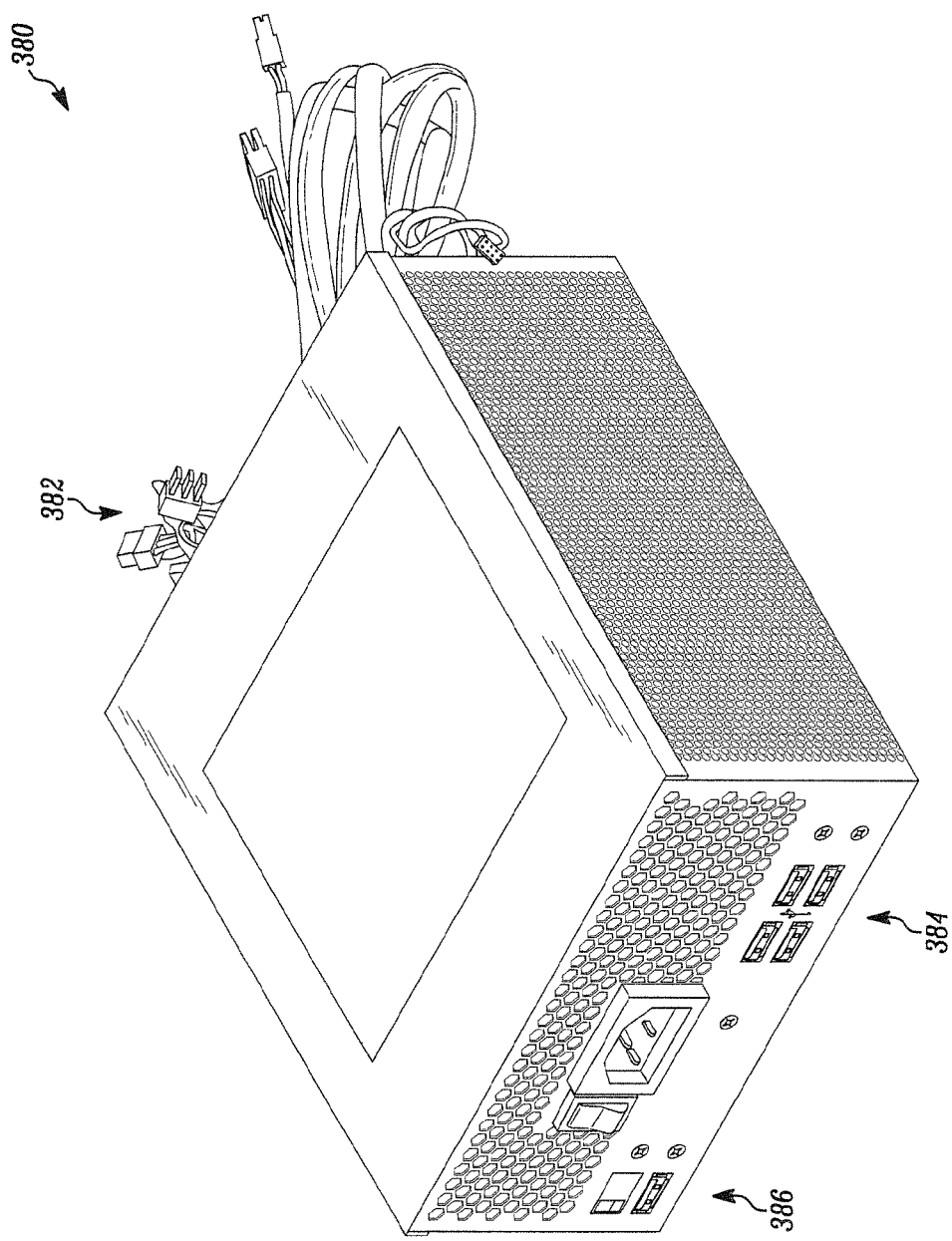

FIG. 3E illustrates a power supply unit that can be used with the systems taught herein. The power supply unit 380 can be installed internal to the PC case or tower, or it can be connect external to the PC. In some embodiments, the power supply unit 380 has six, 12V rails [4×30 Amps/2×18 Amps] designed for high-end audio amplification and gaming peripherals that require large power requirements. The unit 380 can deliver a continuous stream of 1240 W of power with a maximum power output of 1600 watts. In another embodiment, the power supply 380 can deliver a maximum output of 1200 W and is identical to the 1600 W unit 380 with exception of having only four, 12V rails [2×30 Amps/2×18 Amps].

In some embodiments, the power supply unit 380 has a built-in 4-port USB 2.0 hub 384 and an additional charging port 386 for charging up portable devices such as MP3 players, digital cameras, and cell phones on the rear of the unit 380. It also incorporates a new technology called ULTRA-PURE PC/DC, which will provide heavy-duty DC filtering on the high-power 12V rails to provide what one of skill would consider as pure, clean voltage to safely and cleanly power studio-quality audio equipment.

Main power cables 382 can be ATX 2.2 compatible hard-wired power cables that include 1× main ATX 24 pin connector, 1× ESP12V (8 pin) connector, 1× ATX12V 8 pin connector, 4× PCI-E 2.0 (8 pin), 2×PCI-E 1.0 (6 pin) connector, one cable with 3× serial ATA power connectors, three cables with 2× MOLEX connectors and a three pin fan RPM sensor cable for the motherboard. All openings that allow cabling to exit the housing are properly grommeted to protect the cabling, and all harnesses have high-quality mesh coating to make cable management clean and easy. The mesh sleeves also keep the wires compacted to ensure proper airflow through your enclosure. The built-in 4-Port Hi-Speed USB 2.0 hub 384 works at any USB speed, and when you connect it with a Hi-Speed USB 2.0 printer, video camera, or other device, it transfers data at speeds up to 480 Mbps. The built-in USB charging port 386 is auto-switching and is capable of charging mobile phones, digital cameras, iPod's, PSP's, MP3 Players, PDA's, and many other portable USB-compatible devices.

The system provides for controlling the output of audio data. In some embodiments, controlling of audio data includes mixing audio data between the PC and auxiliary audio equipment, adding or subtracting bass, midrange, treble, and balancing or selecting audio channel output and levels. In some embodiments, controlling audio data includes digitally distorting or modifying the audio data through gain, overdrive (i.e., similar to distortion without clipping, by pushing prevolume to higher than circuit capacity, within a gated level), tone (i.e, a combination of bass/mid/treble), chorus (i.e., a data multiplication/overlay to multiply audio data to make one sound into two and overlaying them to sound like many), distortion (i.e., an intentional clipping of audio data, for example, making smooth guitar rough), reverb (i.e., a persistence of sound in a particular space after the original sound is removed), and delay (i.e., a time shift of audio).

In some embodiments, the multimedia system comprises a receiver of audio and video data for television such as, for example, an HDTV receiver, wherein the receiver of audio and video data is operably connected to the system to amplify the audio data. In some embodiments, the multimedia system comprises a receiver for audio data for radio, wherein the receiver of audio data is operably connected to the system to amplify the audio data.

The multimedia system can further comprise an audio effects bay operably connected to the system for altering the audio data from the one or more sources. In some embodiments, the multimedia system can further comprise one or more components selected from the group consisting of a disc player, a TV tuner and/or digital video recorder/receiver, a graphic equalizer, and a studio mixer. In some embodiments, the one or more components operably connect to the system, communicate with the studio controller, and have a form factor complementary to a 5.25 inch drive bay of a workstation computer.

The multimedia system can further comprise a peripheral amplifier extension card, as described herein, operably connected to the system. The extension card is used to support an additional audio zone by providing additional power and channels. In some embodiments, the extension card provides additional technologies to support functions that add to the functions of the amplifier card. In some embodiments, for example, the extension card is used to power 5 speakers and provide a user with surround sound. The extension card can have a routing function, for example, to split an input audio into more than two channels.

The extension card can comprise a second circuit board having (i) at least three audio channels; (ii) an audio power amplification circuit for amplifying audio power to at least 20 W RMS per channel; and (iii) an onboard cooling system; and a mounting bracket operably connected to the second circuit board and having I/O ports. In these embodiments, the extension card operably interfaces with the motherboard of the computer and the amplifier card. The multimedia system can comprise at least 5 audio output channels.

In some embodiments, the multimedia system can comprise an auto-amplifier bridge gate. The auto-amplifier bridge gate can function, for example, to (i) identify the absence of a passive speaker load at an audio output port of the extension card and (ii) bridge power generated by the extension card back to the expansion card to increase the audio power output of the expansion card. One of skill will appreciate that the auto-amplifier bridge gate can function to increase the primary stereo output total RMS power and, in some embodiments, essentially double or triple the power to the stereo outputs of the amplifier card.

The multimedia system can include an expansion card comprising (i) 2 channels having at least 50 W RMS per channel, and (ii) an onboard cooling system. In some embodiments, the peripheral amplifier extension card can have (i) 3 audio output channels consisting of 2 audio output channels having at least 50 W RMS per channel and 1 audio output channel having at least 75 W RMS per channel; and (ii) an onboard cooling system. In some embodiments, the peripheral amplifier extension card comprises (i) 5 audio output channels consisting of 4 audio output channels having at least 50 W RMS per channel and 1 audio output channel having at least 75 W RMS per channel; and (ii) an onboard cooling system. The multimedia system can comprise at least 7 audio output channels.

Figure 4A:
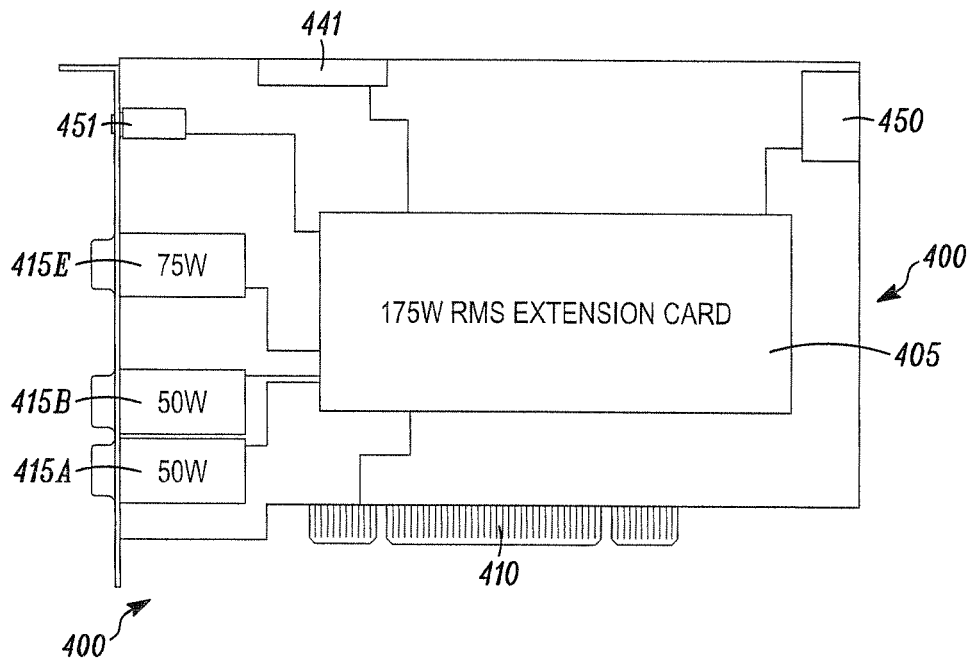
FIGS. 4A and 4B illustrate examples of the extension card that can provide a user with 5.1 surround-sound or 7.1 surround-sound when used with the amplifier card.
Figure 4B:
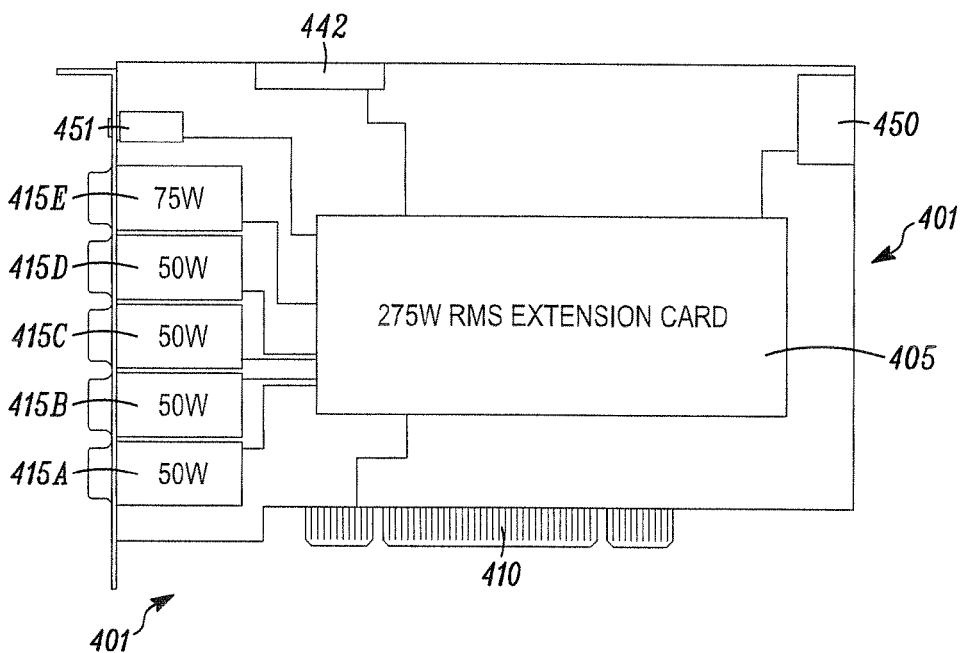

FIGS. 4A and 4B illustrate examples of the extension card that can provide a user with 5.1 surround-sound or 7.1 surround-sound when used with the expansion card. FIG. 4A shows a 3-channel discrete power amplifier extension card with auto-amplifier bridge gate technology. The use of this extension card with the amplifier card can provide a user with 5.1 surround-sound. FIG. 4B shows a 5-channel discrete power amplifier extension card with auto-amplifier bridge gate technology. The use of this extension card with the amplifier card can provide a user with 7.1 surround-sound. The amplifier circuitry 405 can comprise a discrete power amplifier designed to fit and function on a PCI (Peripheral Component Interconnect), PCIe (Peripheral Component Interconnect Express), or PCI-X (PCI extended) type card. Connector 410 is an interface for connecting the extension card to the computer. FIG. 1C illustrates an example of interface connectors 110A-110C that can be used in various form factors to interface with desktop or multi-media computer motherboards.

It should be appreciated that, in many embodiments, the extension card 400 is not dependant on a specific PCI connection design. For example, the extension card 400 can be designed in any form factor known to one of skill to be useful according to the teachings provided herein and can be altered, modified, or replaced by changing its form factor to any other internal ATX computer hardware component such as, for example, a 5.25" drive bay box, a 3.5" drive bay box, or a hard-drive rack component. Moreover, the PCI, PCI-X, and PCIe form factors can be altered, modified, or replaced, for example, by replacing the current production standards of the PCI connection with any of a variety of interfaces that can be contemplated by one of skill.

It should also be appreciated that, in some embodiments, the amplifier circuitry can be altered, modified, or replaced with components known to one of skill. In some embodiments, integrated type circuitry can be used. For example, the amplifier circuitry can be modified using IC-type power amplifier chips that include, but are not limited to, LM3876 or LM3886 audio power amplifier integrated circuit chips available from National Semiconductor of Santa Clara, Calif.

Amplified audio data output can be transmitted from the extension card 400, 401 through any connector, configuration, or other means, including wireless means, known to one of skill. The amplified audio can be transmitted through R/L audio outputs 415A, 415B, for example, of extension card 400 for 5.1 surround-sound when used in conjunction with the amplifier card, or through audio outputs 415A, 415B, 415C, 415D, for example, of extension card 401 for 7.1 surround-sound when used in conjunction with the amplifier card. In some embodiments, the amplifier card can provide 2×50 W outputs 115A, 115B and the extension card can provide 2×50 W outputs 415A, 415B and a 75 W output 415E to provide 5.1 surround-sound. In some embodiments, the amplifier card can provide 2×50 W outputs 115A, 115B and the extension card can provide 4×50 W outputs 415A, 415B, 415C, 415D and a 75 W output 415E to provide 7.1 surround-sound.

The audio outputs can comprise, for example, ¼" phone speaker power outputs, which are ¼" phone jacks (a 2-conductor tip-sleeve configuration) for heavy-duty loudspeaker applications. It should be appreciated, however, that the audio outputs can be altered, modified, or replaced by any jack type configuration known to one of skill. The amplifier card I/O 441, 442 and MOLEX power supply input 450 are as discussed in FIG. 1. In addition, the extension cards 400, 401 have an auxiliary power adaptor input 451 that can be used as an optional power adaptor if the voltage available from the power supply unit is insufficient. In some embodiments, the auxiliary power adaptor input 451 comprises a 5.5 mm coax auxiliary power adaptor input having a 5.5 mm coax connector.

The amplifier card and extension cards can comprise an onboard cooling system to assist in removing the heat that is produced by the amplification. In some embodiments, the onboard cooling system can comprise a fan and liquid cooling.

Figure 5A:
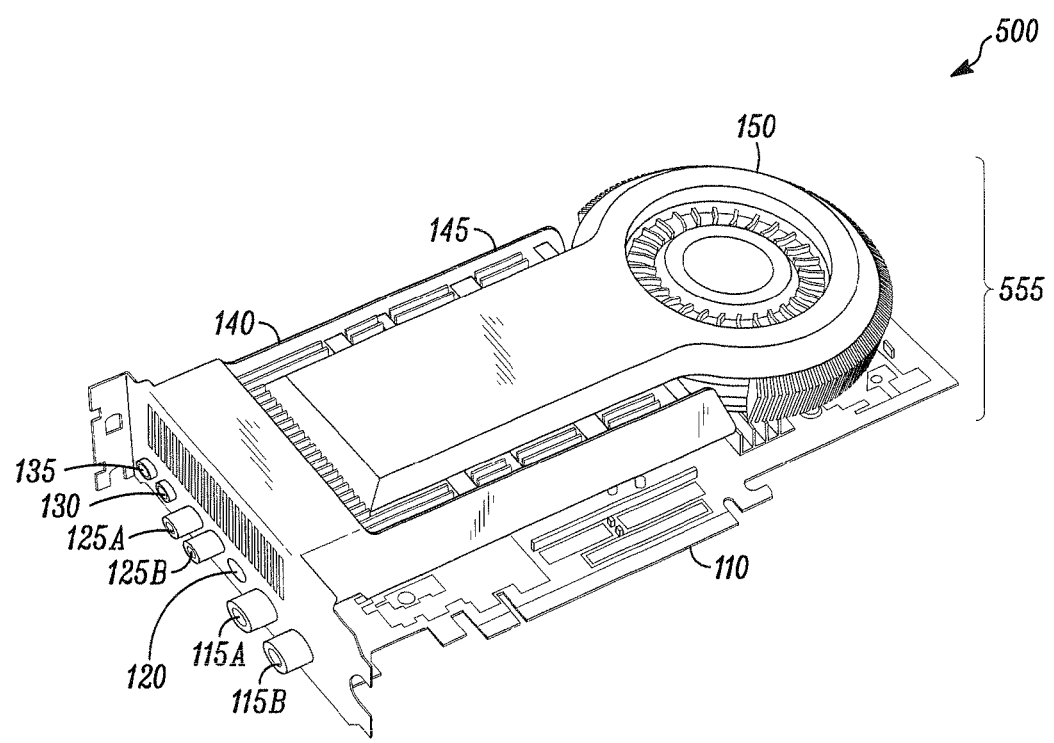
FIGS. 5A through 5C illustrate examples of an amplifier card and extension cards having liquid and fan cooling, according to some embodiments.
Figure 5B:
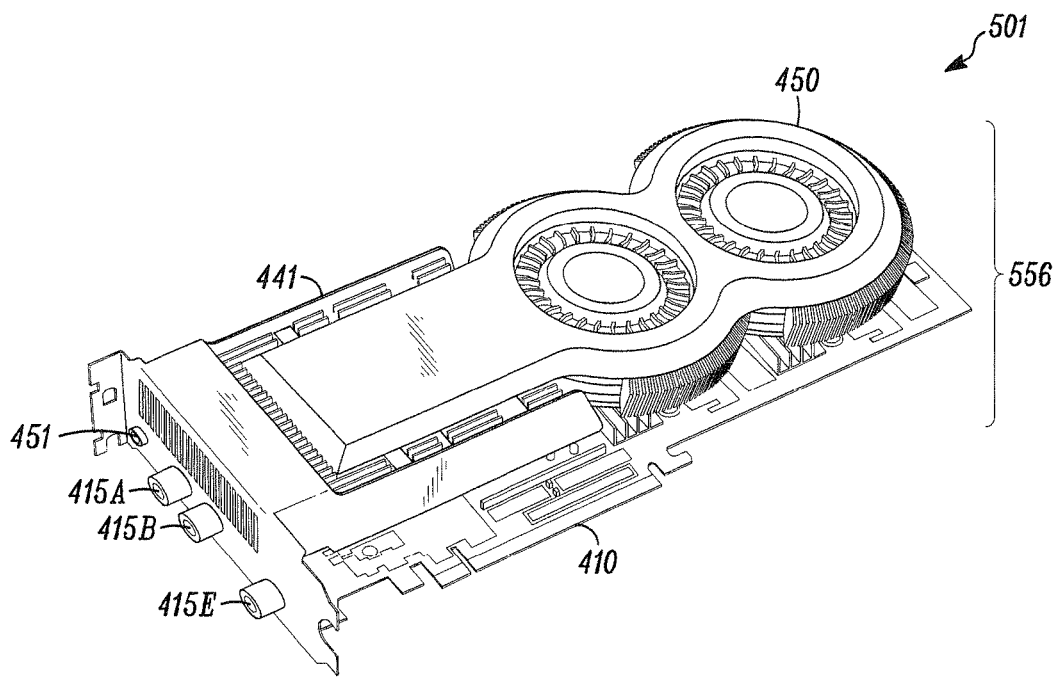
Figure 5C:
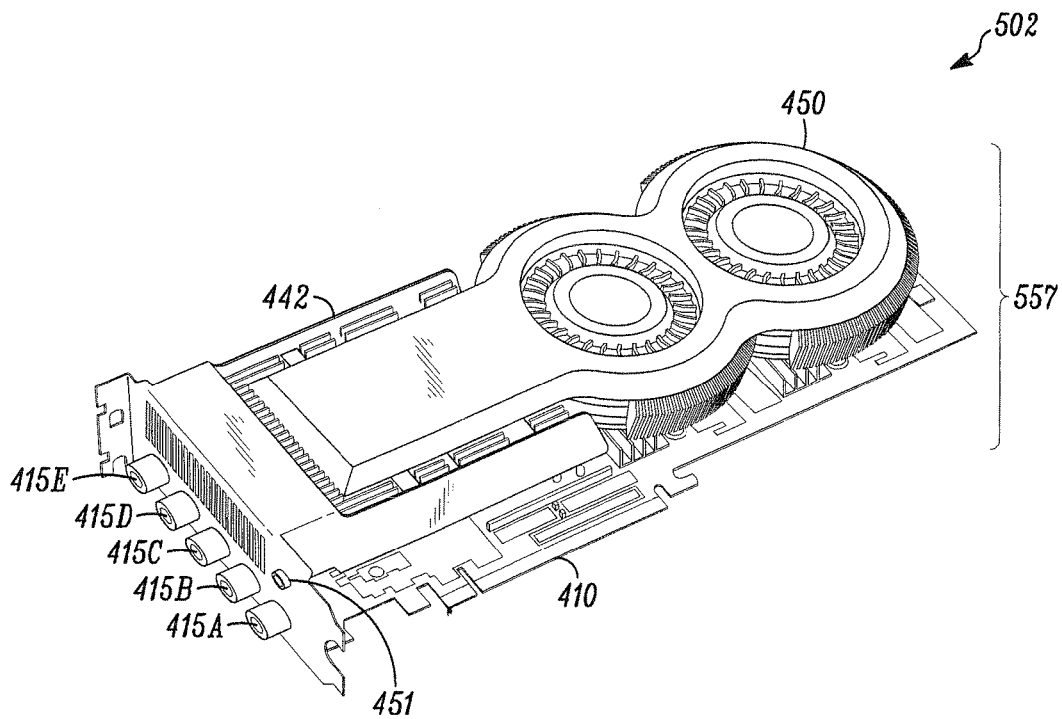

FIGS. 5A through 5C illustrate examples of amplifier cards and extension cards having liquid and fan cooling, according to some embodiments. The amplifier card 100 of FIG. 1 is shown having liquid and fan cooling 555 in FIG. 5A. The extensions cards of FIGS. 4A and 4B, 400 and 401, respectively shown as 501,502, have liquid and fan cooling, respectively shown as onboard cooling systems 556 and 557 in FIGS. 5B and 5C.

Figure 6A:
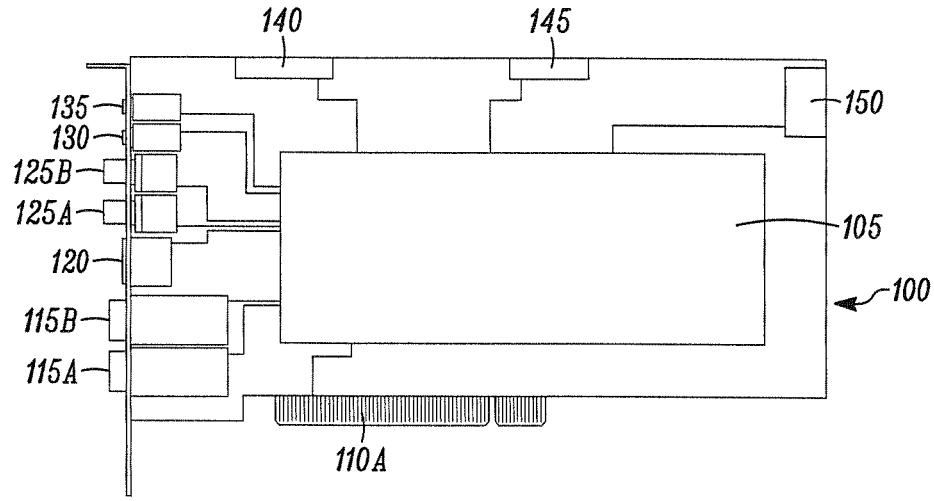
FIGS. 6A and 6B illustrate the basic circuitry and operation of the amplifier card, according to some embodiments.
Figure 6B:
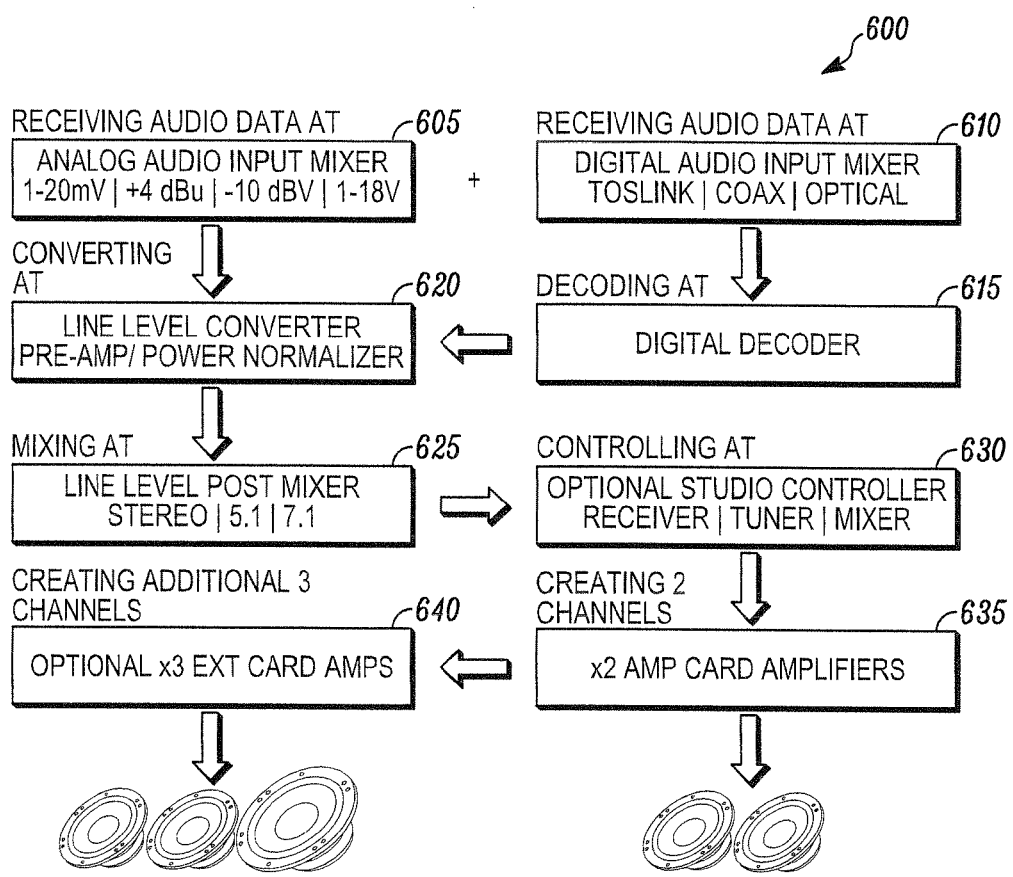

FIGS. 6A and 6B illustrate the basic circuitry and operation of the amplifier card, according to some embodiments. The basic circuitry of the amplifier card 100 is discussed in reference to FIG. 1. Flowchart 600 shows the process in steps that include receiving analog audio input by an analog audio input mixer 605. The analog audio data is received through auxiliary line inputs 125A,125B and/or stereo line input 130. The amplifier card's analog audio input mixer 605 takes mono or stereo audio data from the inputs 125A,125B,130 and, in some embodiments, an intelligent auto-sense function recognizes that the inputs 125A, 125B, 130 are active and turns the expansion card on or off, depending on whether the inputs remain active. In the alternative, or concurrently, the step of receiving analog audio input by a digital audio input mixer 610 can receive digital audio through, for example, TOSLINK, coax, or optical data through input 120, and the intelligent auto-sense function can again recognize the activity of these inputs and turn the amplifier card on or off according to activity at input 120 as well. If the input is a digital-type 9-pin Mini-DIN breakout to TOSLINK, coax, or optical audio, the digital data gets decoded to 5.1 or 7.1 channel analog. If the input is an analog-type 9-pin Mini-DIN breakout to 7 individual ⅛" mono plugs, the switch on pin 9 routes the analog data to a bypass decoder. Analog and digital audio data can be received simultaneously in some embodiments.

In some embodiments, the process includes decoding 615 the digital audio data with a digital decoder for decoding digital audio data to analog audio data and then converting 620 the decoded audio data by a line level converter. The line level converter receives audio data from the analog audio input mixer and/or the digital audio input mixer after decoding 615 at the digital decoder.

Converting 620 of the audio data occurs at the line level converter. The line level converter either preamplifies or normalizes the audio data to about −10 dBV. The line level post-mixer receives and mixes the audio data to stereo or divides the audio data into 5 or 7. A studio controller can be used to receive all available channel audio data from the line level post-mixer audio data through input 145 and manipulate the audio data by, for example, employing boost, cut, tone, balance, and the like, to modify the sounds. If no studio controller is present, the audio data is bridged directly to the appropriate extension card and/or expansion card amplifier circuits.

The expansion card amplifiers take the mixed audio data from the bridged line level post-mixer or from the optional studio controller, if present, and amplifies the audio data to high power passive speaker levels at outputs 115A, 115B (creating 2 channels 635; e.g., mono or stereo) where, as discussed herein, the performance of the amplifier card can depend on the amount of available supply voltage from the system's main power supply unit at input 150. The extension card, if present at input 140, amplifies audio signals from the bridged line level post-mixer 625 or from the optional studio controller and amplifies the audio data to high power passive speaker levels at outputs 115A, 115B and 415A, 415B, 415E (creating an additional 3 channels 640, e.g., 5.1 surround-sound) or outputs 115A, 115B and 415A, 415B, 415C, 415D, 415E (additional 5 channels, e.g., 7.1 surround-sound).

The teachings also include a multizone audio amplification system. The multizone audio amplification system comprises an amplification card as described above, as well as an extension card operably connected to the system. The extension card comprises a second circuit board having (i) at least 3 audio output channels; (ii) an audio power amplification circuit for amplifying audio power to at least 20 W RMS per channel; and (iii) an onboard cooling system. In these embodiments, the extension card can have a mounting bracket operably connected to the second circuit board and having I/O ports; wherein, the extension card operably interfaces with the motherboard of the computer. In these embodiments, the multizone audio amplification system can include a studio controller operably connected to the system for further processing of input audio data.

The studio controller can comprise a receiver of audio data from one or more sources, a mixer of the audio data from the one or more sources, state selectors for controlling audio data input and output; and, a field-programmable-gate-array (FPGA) or application-specific-integrated-circuit (ASIC) microprocessor. And, in these embodiments, the multizone audio amplification system can also include a multizone audio amplification manager operably connected to the system and functioning to (i) identify independent sources of audio data input; (ii) split, alternate, or merge the direction of the amplified audio data output; and (iii) provide for a plurality of independent amplified audio data streams.

The multizone audio amplification system can have an amplifier card comprising discrete audio amplifier circuitry. In some embodiments, the discrete audio amplifier circuitry can amplify audio power to at least 50 W RMS per channel in these embodiments, wherein the circuitry can have at least 100 W RMS total audio amplification power.

It should be appreciated that, with the multizone audio amplification system, multiple users can separately amplify independent sources of audio and route the sound to respective independent audio outputs. For example, in some embodiments, a first user can watch television in a first room, while a second user plays a video game in a second room. In some embodiments, the independent outputs can be split, flipped, or merged to redirect media to one or more preferred locations.

Figure 7:
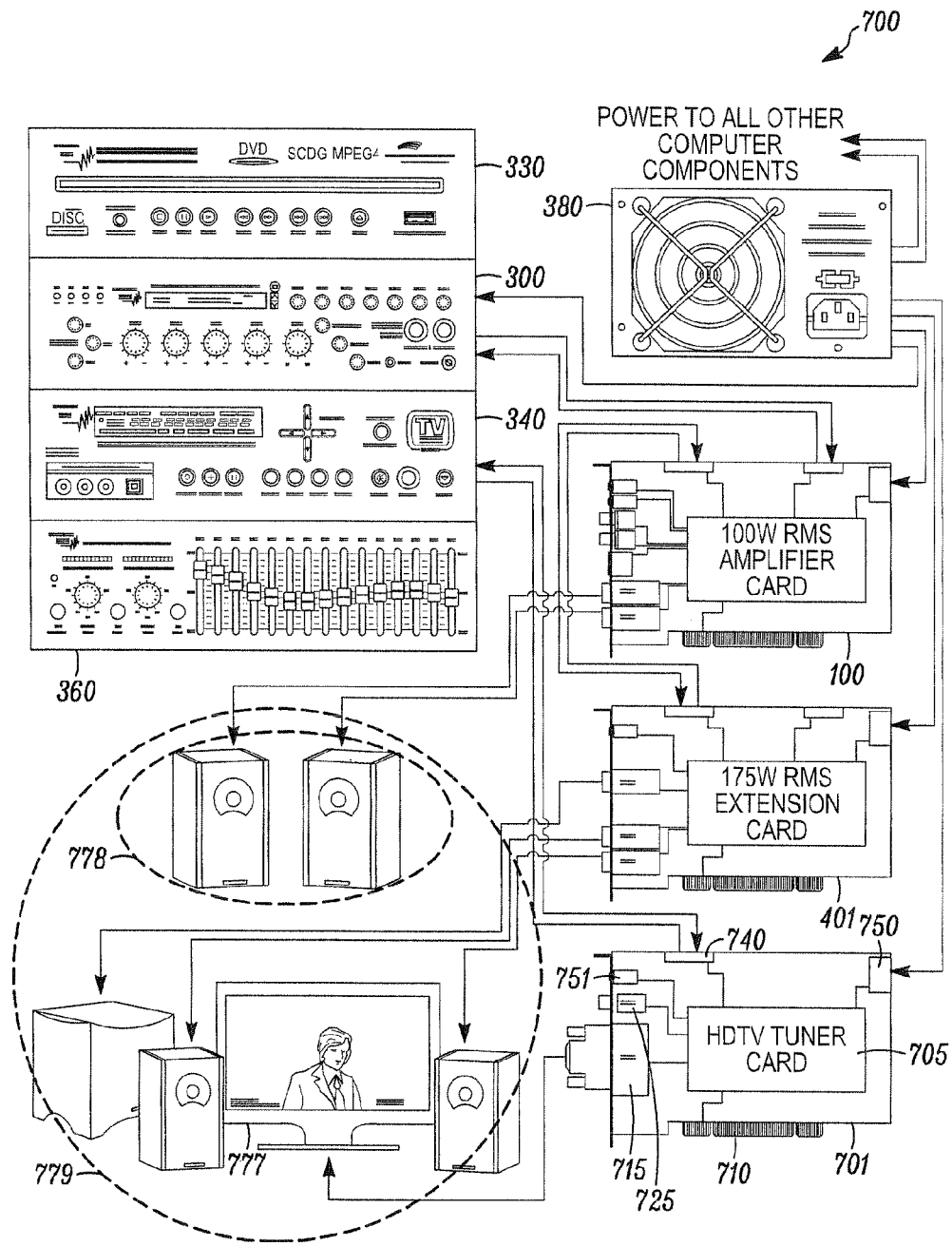
FIG. 7 illustrates a home entertainment system, according to some embodiments.

FIG. 7 illustrates a home entertainment system, according to some embodiments. The home entertainment system 700 is an embodiment that can comprise the amplifier card 100 of FIG. 1, the studio controller 300 of FIG. 3A, the DVD/CD multidisk player 330 of FIG. 3B, the HDTV tuner/HD DVR player 340 of FIG. 3C, the graphic equalizer 360 of FIG. 3D, the extension card 400 of FIG. 4A, and HDTV tuner card 701, wherein each component is operably connected to the system.

The HDTV tuner card 701 comprises the HDTV tuner card circuitry 707, an interface connection 710 for a motherboard, a digital video interface 715 for operably interfacing with a television 777, e.g. sending, digital video data to the television 777, an I/O 741 for the HDTV tuner/HD DVR player 340 and an antenna 725 for receiving video data from a video source. An auxiliary power adaptor input 451 can be used as an optional power adaptor, if the voltage available from the power supply unit is insufficient. In some embodiments, the auxiliary power adaptor input 751 comprises a 5.5 mm coax auxiliary power adaptor input having a 5.5 mm coax connector.

The power supply unit 380 of FIG. 3E is provided to power the system components as illustrated. A 2-channel speaker system 778 can be designed; a 5 channel speaker system 779, e.g. 5.1 surround-sound system, can be designed; or, in some embodiments, a 7-channel, 7.1 surround-sound system (not shown) can be designed for a full home entertainment system having an innovatively small footprint and a disruptive market presence.

In some embodiments, the systems described herein may include an interface to a network, so that the network can send and receive signals related to instructing the system to operate in a desired way, or perhaps, to send information to a recipient, where the information could be the detection of a malfunction in the system. The information can function as a diagnostic, for example, a collection of data to analyze for optimization of the system performance. One of skill will appreciate that any data can be transmitted using wireless technology or wired technology, depending on the design of interest to the user.

One of skill will appreciate that the teachings provided are merely exemplary and non-limiting. For example, it should be appreciated that the methods and apparatus presented herein are not inherently related to any particular materials or uses. Various systems and related programs may be used in accordance with the teachings herein, or it may prove convenient to construct more specialized apparatus to perform the methods of some embodiments. Possible structures, methods, and systems that can be used for each of a variety of these systems can be derived by one of skill given the teachings herein. In addition, the techniques are not described with reference to any particular hardware or programming language and various embodiments may thus be implemented using a variety of programming languages. Accordingly, the terms and examples provided above are illustrative only and not intended to be limiting; and, the term "embodiment," as used herein, means an embodiment that serves to illustrate by way of example and not limitation.

EXAMPLE

The general specifications of an audio power amplifier expansion card can be designed and implemented as follows:

Performance:

Estimated Max Power Output: 2 × 75 W RMS* @ 8 Ohms
Input Levels: +4 dBu/−10 dBV
Distortion: THD <0.09%
Frequency Response: 20Hx-20 kHz ± 1 db
Amplifier Type: Lateral ±30 V MOSFET
Amplifier Cooling: Copper Pin Fin Heat -continued Sink
Power Requirement: 12 Volts @ 12-28 Amps
Dimensions: 6.50" W × 4.125" D × 0.75" H
Inputs ⅛" Stereo Line-In
2 × RCA Stereo Aux Line-In
9 Pin Mini-DIN 7 Channel Line-In
Outputs 2 × ¼" Phone Passive Speaker L|R Out
⅛" Stereo Mix Line-Out
Connectors Molex PSU Power Input
Studio Controller Receiver/Mixer I/O
Extension Card I/O
Features Auto-sense Input Data Sensing
Auto Bridge Mini-DIN Channels to Stereo
2 × 6.0 A User Serviceable Fuses
Gold Plated Jacks & Connectors
Internally Powered by Computer PSU
No Software, Drivers or Memory Required
Digital/Discrete Electronic Circuitry
Accessories 2 × 12' Hi-Fi 14/2 CL3-Rated Speaker Cables
36" 3.5 mm Stereo Patch Cable
36" RCA Stereo Patch Cable
9 Pin Mini-DIN Breakout Input Adapter

We claim:

1. A multimedia system, comprising:
an audio power amplifier expansion card operably connected to the multimedia system and having
a circuit board including (i) at least two audio channels; (ii) an audio power amplification circuit for amplifying audio power to at least 20 W RMS per channel; and, (iii) an onboard cooling system;
wherein, the expansion card operably interfaces with a motherboard of a computer;
a studio controller operably connected to the expansion card for receiving and processing input audio data, the studio controller having
a receiver of audio data from one or more sources;
a mixer of the audio data from the one or more sources;
state selectors for controlling audio data input and output; and,
a field-programmable-gate-array (FPGA) or application-specific-integrated-circuit (ASIC) microprocessor;
and,
a peripheral amplifier extension card operably connected to the system, the extension card comprising a second circuit board having
(i) at least three audio channels;
(ii) an audio power amplification circuit for amplifying audio power to at least 20 W RMS per channel; and, (iii) an onboard cooling system;
wherein, the extension card operably interfaces with the motherboard of the computer and the expansion card; and the multimedia system comprises at least 5 audio output channels.

2. The multimedia system of claim 1, further comprising an auto-amplifier bridge gate functioning to (i) identify the absence of a passive speaker load at an audio output port of the extension card and (ii) bridge power generated by the extension card back to the expansion card to increase the audio power output of the expansion card.

3. The multimedia system of claim 1; wherein,
the expansion card has (i) 2 audio output channels having at least 50 W RMS perchannel, and (ii) an onboard cooling system; and
the peripheral amplifier extension card has (i) 3 audio output channels consisting of 2 audio output channels having at least 50 W RMS per channel and 1 audio output channel having at least 75 W RMS per channel; and (ii) an onboard cooling system.

4. The multimedia system of claim 1; wherein,
the expansion card comprises (i) 2 audio output channels having at least 50 W RMS per channel, and (ii) an onboard cooling system; and,
the peripheral amplifier extension card comprises (i) 5 audio output channels consisting of 4 audio output channels having at least 50 W RMS per channel and 1 audio output channel having at least 75 W RMS per channel; and (ii) an onboard cooling system;
wherein, the multimedia system comprises at least 7 audio output channels.

5. The multimedia system of claim 1, further comprising a receiver of audio and video data for television, wherein the receiver of audio and video data is operably connected to the system to amplify the audio data.

6. The multimedia system of claim 1, further comprising a receiver for audio data for radio, wherein the receiver of audio data is operably connected to the system to amplify the audio data.

7. The multimedia system of claim 1, further comprising an audio effects bay operably connected to the system for altering the audio data from the one or more sources.

8. The multimedia system of claim 1, wherein the system comprises one or more components selected from the group consisting of a disc player, a TV tuner and/or digital video recorder/receiver, a graphic equalizer, and a studio mixer; wherein, the one or more components operably connect to the system, communicate with the studio controller, and have a form factor complementary to a 5.25 inch drive bay of a workstation computer.

9. The multimedia system of claim 1, wherein the audio power amplification circuit amplifies audio power to at least 50 W RMS per channel and having at least 100 W RMS total audio amplification power.

10. The multimedia system of claim 1, wherein the audio power amplification circuit comprises an output stage consisting of discrete circuitry.

11. The multimedia system of claim 1, wherein the audio power amplification circuit comprises integrated audio amplifier circuitry.

12. The multimedia system of claim 1, wherein the expansion card functions to receive and amplify audio data having a frequency from about 10 Hz to about 100 kHz.

13. The multimedia system of claim 1, further comprising audio mixing functionality for splitting mono audio into at least two audio channels or combining more than two audio channels into two audio channels.

14. The multimedia system of claim 1, further comprising audio routing functionality for splitting audio into more than two audio channels.

15. The multimedia system of claim 1, functioning to (i) receive and amplify standard digital audio data, standard analog audio data, or a combination thereof; and optionally, (ii) operate independent of operation of the computer.

16. A multi-zone audio amplification system, comprising:
an audio power amplifier expansion card operably connected to the multimedia system and having
a circuit board including (i) at least two audio channels; (ii) an audio power amplification circuit for amplifying audio power to at least 20 W RMS per channel; and (iii) an onboard cooling system;
wherein, the expansion card operably interfaces with a motherboard of a computer;
a peripheral amplifier extension card operably connected to the system, the extension card comprising a second circuit board having
(i) at least three audio channels;
(ii) an audio power amplification circuit for amplifying audio power to at least 20 W RMS per channel; and,
(iii) an onboard cooling system;
wherein, the extension card operably interfaces with the motherboard of the computer and the expansion card; and the multimedia system comprises at least 5 audio output channels;
a studio controller operably connected to the expansion card for receiving and processing input audio data, the studio controller having
a receiver of audio data from one or more sources;
a mixer of the audio data from the one or more sources;
state selectors for controlling audio data input and output; and,
a field-programmable-gate-array (FPGA) or application-specific-integrated-circuit (ASIC) microprocessor;
and,
a multi-zone audio amplification manager operably connected to the system and functioning to (i) identify independent sources of audio data input; (ii) split, alternate, or merge the direction of the amplified audio data output; and (iii) provide for a plurality of independent amplified audio data streams.

17. The multi-zone audio amplification system of claim 16, wherein the expansion card comprises discrete audio amplifier circuitry, amplifies audio power to at least 50 W RMS per channel, and has at least 100 W RMS total audio amplification power.

18. The multi-zone audio amplification system of claim 16, further comprising a receiver of audio and video data for television, wherein the receiver of audio and video data is operably connected to the system to amplify the audio data.

19. The multi-zone audio amplification system of claim 16, further comprising a receiver for audio data for radio, wherein the receiver of audio data is operably connected to the system to amplify the audio data.

20. The multi-zone audio amplification system of claim 16, further comprising an audio effects bay operably connected to the system for altering the audio data from the one or more sources.

* * * * *